(12) United States Patent
Vasudevan et al.

(10) Patent No.: US 12,367,328 B1
(45) Date of Patent: Jul. 22, 2025

(54) SYSTEMS AND METHODS FOR FORMAL VERIFICATION OF COMPUTER PLATFORMS

(71) Applicant: Uberspark Inc., Aledo, TX (US)

(72) Inventors: Amit Vasudevan, Aledo, TX (US); Ajit Vasudevan, San Jose, CA (US); Michael J McCall, Pittsburgh, PA (US)

(73) Assignee: UBERSPARK INC., Aledo, TX (US)

( * ) Notice: Subject to any disclaimer, the term of this patent is extended or adjusted under 35 U.S.C. 154(b) by 0 days.

(21) Appl. No.: 19/071,693

(22) Filed: Mar. 5, 2025

Related U.S. Application Data

(60) Provisional application No. 63/727,719, filed on Dec. 4, 2024.

(51) Int. Cl.
*G06F 30/20* (2020.01)
*G06F 13/28* (2006.01)

(52) U.S. Cl.
CPC .............. *G06F 30/20* (2020.01); *G06F 13/28* (2013.01)

(58) Field of Classification Search
CPC ................................ G06F 30/20; G06F 13/28
See application file for complete search history.

(56) References Cited

U.S. PATENT DOCUMENTS

| 8,627,414 | B1 | 1/2014 | McCune et al. |
| 12,093,367 | B2 | 9/2024 | Vasudevan |
| 2024/0267736 | A1 | 8/2024 | Vasudevan et al. |

(Continued)

FOREIGN PATENT DOCUMENTS

WO     2024163410     8/2024

OTHER PUBLICATIONS

McCormack M, Vasudevan A, Liu G, Sekar V. Formalizing an Architectural Model of a Trustworthy Edge IoT Security Gateway. In2021 IEEE 27th International Conference on Embedded and Real-Time Computing Systems and Applications (RTCSA) Aug. 18, 2021 (pp. 93-102). IEEE. (Year: 2021).*

(Continued)

*Primary Examiner* — Chuen-Meei Gan
(74) *Attorney, Agent, or Firm* — Zachary M. Thomas

(57) ABSTRACT

Systems and methods for mathematical modeling of the hardware and software stack of commodity computer platforms are provided, enabling provable guarantees on memory, device, and program execution. This approach addresses the technical problem of reliance on system agents that rely on implicit trust in the operating environment, which can be exploited by sophisticated attackers using complex threats such as memory access exploits and code/data integrity exploits. The solution provides a proactive, mathematically-backed security solution that eliminates entire classes of cyberattacks by design, ensuring realizable guarantees on commodity computer platforms running hardware and software stack elements at the lowest operating level. This approach has significant advantages over current reactive cybersecurity methods, including reduced complexity and overhead, and increased confidence in the integrity of the system. The solution's main uses include providing mathematically-backed security and availability guarantees for critical infrastructure, financial institutions, and other organizations vulnerable to cyberattacks.

16 Claims, 29 Drawing Sheets

(56) References Cited

U.S. PATENT DOCUMENTS

2024/0289432 A1  8/2024  Vasudevan
2024/0346132 A1  10/2024  Vasudevan et al.

OTHER PUBLICATIONS

Derakhshan F, Zhang Z, Vasudevan A, Jia L. Towards end-to-end verified TEEs via verified interface conformance and certified compilers. In 2023 IEEE 36th Computer Security Foundations Symposium (CSF) Jul. 10, 2023 (pp. 324-339). IEEE. (Year: 2023).*

Vasudevan A, Maniatis P, Martins R. überSpark: Practical, Provable, End-to-End Guarantees on Commodity Heterogenous Interconnected Computing Platforms. ACM SIGOPS Operating Systems Review. Aug. 31, 2020;54(1):8-22. (Year: 2020).*

Mccormack M, Vasudevan A, Liu G, Yu T, Chandrasekaran S, Singer B, Echeverria Galvez S, Lewis G, Sekar V. Jetfire: A Low-Cost, Trusted IoT Security Gateway (CMU-CyLab-20-002). (Year: 2020).*

* cited by examiner

1001

```
procedure dma_op (do_p_tlm_idx, do_p_mmu_idx, do_p_mmu_idx_qual,
do_p_type)
variables
do_rs_element = <<>>;
begin
do1: if do_p_tlm_idx > MAX_PLATFORM_TLM_IDX then
assert FALSE;
else
\* construct read_set comparison element
if do_p_mmu_idx = PLATFORM_CPU_MMU_UOBJCOLLDMA_IDX then
do_rs_element := <<PLATFORM_CPU_MMU_UOBJCOLLDMA_IDX,
do_p_mmu_idx_qual>>;
elsif do_p_mmu_idx = PLATFORM_CPU_MMU_UOBJCOLLTLMDMA_IDX then
do_rs_element := <<PLATFORM_CPU_MMU_UOBJCOLLTLMDMA_IDX,
do_p_mmu_idx_qual>>;
elsif do_p_mmu_idx >= PLATFORM_CPU_MMU_MAX_IDX then
do_rs_element := <<>>;
else
do_rs_element := <<do_p_mmu_idx, -1>>;
end if;
if do_p_type = DMA_OP_READ then
if do_rs_element \in dma_tlb[self][do_p_tlm_idx].read_set then
\* this is in the read_set, so allow DMA
do2a: skip;
else
\* raise DMA exception
do2b: skip;
end if;
elsif do_p_type = DMA_OP_WRITE then
if do_rs_element \in dma_tlb[self][do_p_tlm_idx].write_set then
\* this is in the write_set, so allow DMA
do2c: skip;
else
\* raise DMA exception
do2d: skip;
end if;
else
assert FALSE; \* model error
end if;
end if;
do: return;
end procedure;
```

```
process platform_id \in PLATFORM_INDEX_START..PLATFORM_INDEX_END
variables plat_l_tlm_index = 0;
begin
\* populate platform tlm_info
plat00a: call platform_tlm_info_init ();
\* populate uobj tlm data
plat00b: call platform_uobj_tlm_data_init ();
\* set the boot-strap processor bsp flag for this platform
plat0a: cpu[CPU_INDEX_START + (self * MAX_CPU_PER_PLATFORM)].bsp :=
TRUE;
\* set PC and CPL of boot-strap processor to for this platform
plat0b: cpu[CPU_INDEX_START + (self * MAX_CPU_PER_PLATFORM)].pc :=
PLATFORM_CPU_PC_UOBJCOLL_ENTRY_SENTINEL_INIT;
\* plat0c: cpu[CPU_INDEX_START + (self * MAX_CPU_PER_PLATFORM)].cpl :=
PLATFORM_CPU_CPL_UOBJCOLL; \* ""
\* boot the boot-strap processor for this platform
plat0d: cpu[CPU_INDEX_START + (self * MAX_CPU_PER_PLATFORM)].state :=
PLATFORM_CPU_STATE_RUNNING_INIT;
plat2: while TRUE do
plat3: either
\* perform a DMA transaction
call platform_dma_actions ();
or
\* deliver external interrupt
call platform_gen_interrupt ();
end either;
end while;
end process;
```

```
procedure uobj_dma_pc_actions_write_to_uobj_data ()
begin
\* setup DMA TLB data structure for TLMs defined in tlm_info by
platform_tlm_info_init ()
\* TLM 0 is of type PLATFORM_TLM_TYPE_UOBJCOLLDMA, so has empty read
and write set
udpawtud1a: dma_tlb[cpu[self].plat_id][0].read_set := {};
udpawtud1b: dma_tlb[cpu[self].plat_id][0].write_set := {};
\* TLM 1 is of type PLATFORM_TLM_TYPE_UOBJCOLL, set up to read/write
UOBJCOLLDMA MMU IDX
\* with UOBJID of UOBJ_UAPP_START_IDX
udpawtud2a_: dma_tlb[cpu[self].plat_id][1].uobj_id := UOBJ_UAPP_START_IDX;
udpawtud2a: dma_tlb[cpu[self].plat_id][1].read_set := {
<<PLATFORM_CPU_MMU_UOBJCOLLDMA_IDX, UOBJ_UAPP_START_IDX>>,
<<PLATFORM_CPU_MMU_UOBJCOLLTLMDMA_IDX, 1>> };
udpawtud2b: dma_tlb[cpu[self].plat_id][1].write_set := {
<<PLATFORM_CPU_MMU_UOBJCOLLDMA_IDX, UOBJ_UAPP_START_IDX>>,
<<PLATFORM_CPU_MMU_UOBJCOLLTLMDMA_IDX, 1>> };
\* TLM 2 is of type PLATFORM_TLM_TYPE_LEGACY, set up to read/write
LEGACY MMU IDX
udpawtud3a: dma_tlb[cpu[self].plat_id][2].read_set := {
<<PLATFORM_CPU_MMU_LEGACY_IDX, -1>> };
udpawtud3b: dma_tlb[cpu[self].plat_id][2].write_set := {
<<PLATFORM_CPU_MMU_LEGACY_IDX, -1>> };
udpawtud: return;
end procedure
```

```
procedure platform_dma_actions ()
begin
pda0: either
\* DMA read operation (MMU idx)
with pda_l_tlm_idx \in 0..MAX_PLATFORM_TLM_IDX,
pda_l_mmu_idx \in {PLATFORM_CPU_MMU_UOBJCOLL_IDX,
PLATFORM_CPU_MMU_UOBJCOLLTLM_IDX,
PLATFORM_CPU_MMU_UOBJCOLLSENTINELS_IDX,
PLATFORM_CPU_MMU_LEGACY_IDX} do
call dma_op(pda_l_tlm_idx, pda_l_mmu_idx, UOBJ_INVALID_IDX,
DMA_OP_READ);
end with;
or
\* DMA read operation (UOBJCOLLTLMDMA MMU idx + tlm id)
with pda_l_tlm_idx \in 0..MAX_PLATFORM_TLM_IDX do
call dma_op(pda_l_tlm_idx, PLATFORM_CPU_MMU_UOBJCOLLTLMDMA_IDX,
pda_l_tlm_idx, DMA_OP_READ);
end with;
or
\* DMA write operation (MMU idx)
with pda_l_tlm_idx \in 0..MAX_PLATFORM_TLM_IDX,
pda_l_mmu_idx \in {PLATFORM_CPU_MMU_UOBJCOLL_IDX,
PLATFORM_CPU_MMU_UOBJCOLLTLM_IDX,
PLATFORM_CPU_MMU_UOBJCOLLSENTINELS_IDX,
PLATFORM_CPU_MMU_LEGACY_IDX} do
call dma_op(pda_l_tlm_idx, pda_l_mmu_idx, UOBJ_INVALID_IDX,
DMA_OP_WRITE);
end with;
or
\* DMA write operation (UOBJCOLLTLMDMA MMU idx + tlm id)
with pda_l_tlm_idx \in 0..MAX_PLATFORM_TLM_IDX do
call dma_op(pda_l_tlm_idx, PLATFORM_CPU_MMU_UOBJCOLLTLMDMA_IDX,
pda_l_tlm_idx, DMA_OP_WRITE);
end with;
end either;
pda: return;
end procedure;
```

```
procedure mmu_load (ml_p_mmu_idx, ml_p_mmu_idx_qual,
ml_p_val1, ml_p_val2, ml_p_val3, ml_p_val4,
ml_p_val5, ml_p_val6, ml_p_val7, ml_p_val8)
variables ml_l_temp = 0;
begin
\* ml0: print <<"mmu_load:", "pc:", cpu[ml_p_cpu_id].pc, "cpl:", cpu[ml_p_cpu_id].pc,
"uobj_id:", ml_p_uobj_id, "mmu idx:", ml_p_mmu_idx>>;
ml1: if ml_p_mmu_idx >= PLATFORM_CPU_MMU_MAX_IDX then
assert FALSE;
else
if cpu[self].cpl <= mmu_tlb[ml_p_mmu_idx].rpl /\
PLATFORM_CPU_MMU_OP_READ \in mmu_tlb[ml_p_mmu_idx].op_mask then
if ml_p_mmu_idx = PLATFORM_CPU_MMU_LEGACY_IDX \land ml_p_mmu_idx_qual
=
PLATFORM_CPU_MMU_LEGACY_IDX_QUAL_LEGACYDATA then
\* legacy data read
ml1a: mmu_load_return[self] := 0;
elsif ml_p_mmu_idx = PLATFORM_CPU_MMU_UOBJCOLL_IDX \land
ml_p_mmu_idx_qual =
PLATFORM_CPU_MMU_UOBJCOLL_IDX_QUAL_UOBJ_DATA_READ then
\* uobj data read
ml1b: uobjcoll_memory.uobjs[cpu[self].uobj_id].uobj_data := <<ml_p_val1, ml_p_val2>>;
elsif ml_p_mmu_idx = PLATFORM_CPU_MMU_UOBJCOLL_IDX \land
ml_p_mmu_idx_qual =
PLATFORM_CPU_MMU_UOBJCOLL_IDX_QUAL_UOBJ_LOCALDATA_READ then
\* uobj local data (call frame and local variable) read
ml11b: uobjcoll_memory.uobjs[cpu[self].uobj_id].uobj_localdata := <<ml_p_val1,
ml_p_val2>>;
elsif ml_p_mmu_idx = PLATFORM_CPU_MMU_UOBJCOLL_IDX \land
ml_p_mmu_idx_qual =
PLATFORM_CPU_MMU_UOBJCOLL_IDX_QUAL_UOBJ_DMADATA_READ then
\* uobj dmadata read
ml1c: uobjcoll_memory.uobjs[cpu[self].uobj_id].uobj_dmadata := <<ml_p_val1,
ml_p_val2>>;
elsif ml_p_mmu_idx = PLATFORM_CPU_MMU_UOBJCOLL_IDX \land
ml_p_mmu_idx_qual =
PLATFORM_CPU_MMU_UOBJCOLL_IDX_QUAL_UOBJ_TLMDATA_READ then
\* uobj tlmdata read
ml1d0: uobjcoll_memory.uobjs[cpu[self].uobj_id].uobj_tlmdata[1] := ml_p_val1;
ml1d1: uobjcoll_memory.uobjs[cpu[self].uobj_id].uobj_tlmdata[2] := ml_p_val2;
elsif ml_p_mmu_idx = PLATFORM_CPU_MMU_UOBJCOLL_IDX \land
ml_p_mmu_idx_qual =
PLATFORM_CPU_MMU_UOBJCOLL_IDX_QUAL_UOBJ_INTDATA_READ then
\* uobj intdata read
ml1e: uobjcoll_memory.uobjs[cpu[self].uobj_id].uobj_intdata := <<ml_p_val1,
ml_p_val2>>;
elsif ml_p_mmu_idx = PLATFORM_CPU_MMU_UOBJCOLLTLM_IDX then
```

```
\* uobj tlm data mapping (for legacy read access modeling of uobj tlmdata)
ml1f: mmu_load_return[self] := 0;
elsif ml_p_mmu_idx = PLATFORM_CPU_MMU_UOBJCOLLTLMDMA_IDX
then
\* uobj tlm dmadata mapping (for legacy read access modeling of uobj
dmadata)
ml1g: mmu_load_return[self] := 0;
elsif ml_p_mmu_idx = PLATFORM_CPU_MMU_UOBJCOLLDMA_IDX then
\* uobj tlm dmadata mapping (for legacy read access modeling of uobj
dmadata)
ml1h: mmu_load_return[self] := 0;
elsif ml_p_mmu_idx = PLATFORM_CPU_MMU_UOBJCOLLSENTINELS_IDX
then
\* uobjcoll sentinels mapping (for legacy read access modeling of uobjcoll
sentinels)
ml1i: mmu_load_return[self] := 0;
else
\* invalid ml_p_mmu_idx_qual
assert FALSE;
end if;
else
\* TBD: signal an exception, for now skip processing
ml2mmuexception: skip;
end if;
end if;
ml3: return;
end procedure;
```

FIG. 11B

```
procedure mmu_execute (me_p_pc)                                      1103
variables me_p_mmu_idx = -1;
begin
\* infer MMU_IDX from PC
me0: \*if (me_p_pc > 0 \land me_p_pc < PC_UOBJ_MIN) \lor me_p_pc = 107 then \*
TODO : renumber
if (me_p_pc \in PLATFORM_CPU_PC_UOBJCOLL_ENTRY_SENTINEL_PC_SET )
then
me_p_mmu_idx := PLATFORM_CPU_MMU_UOBJCOLLSENTINELS_IDX;
elsif me_p_pc \in PLATFORM_CPU_PC_UOBJCOLL_EXIT_SENTINEL_PC_SET then
me_p_mmu_idx := PLATFORM_CPU_MMU_UOBJCOLL_IDX;
elsif me_p_pc >= PC_UOBJ_MIN \land me_p_pc <= PC_UOBJ_MAX then
me_p_mmu_idx := PLATFORM_CPU_MMU_UOBJCOLL_IDX;
elsif me_p_pc = PLATFORM_CPU_PC_LEGACY then
me_p_mmu_idx := PLATFORM_CPU_MMU_LEGACY_IDX;
elsif me_p_pc = PLATFORM_CPU_PC_MMU_UOBJCOLLTLM_IDX then
me_p_mmu_idx := PLATFORM_CPU_MMU_UOBJCOLLTLM_IDX;
elsif me_p_pc = PLATFORM_CPU_PC_MMU_UOBJCOLLTLMDMA_IDX then
me_p_mmu_idx := PLATFORM_CPU_MMU_UOBJCOLLTLMDMA_IDX;
elsif me_p_pc = PLATFORM_CPU_PC_MMU_UOBJCOLLDMA_IDX then
me_p_mmu_idx := PLATFORM_CPU_MMU_UOBJCOLLDMA_IDX;
else
assert FALSE;
end if;
me1: if me_p_mmu_idx >= PLATFORM_CPU_MMU_MAX_IDX then
assert FALSE;
else
\* MMU is enabled
if cpu[self].mmu_enabled then
\* check for CPL access
if (cpu[self].cpl <= mmu_tlb[me_p_mmu_idx].rpl /\
PLATFORM_CPU_MMU_OP_EXECUTE \in mmu_tlb[me_p_mmu_idx].op_mask) then
\* we model execute to memory region indexed by me_p_mmu_idx
\* by setting the cpu.pc to me_p_pc
\*if me_p_mmu_idx = PLATFORM_CPU_MMU_UOBJCOLLSENTINELS_IDX then
\* cpu[self].pc_prev := cpu[self].pc || cpu[self].pc :=
PLATFORM_CPU_PC_UOBJCOLL_ENTRY_SENTINEL_INIT;
\*else
cpu[self].pc_prev := cpu[self].pc || cpu[self].pc := me_p_pc;
\*end if;
else
me2: skip;
end if;
else
\* MMU is disabled
cpu[self].pc_prev := cpu[self].pc || cpu[self].pc := me_p_pc;
end if;
end if;
me3: return;
end procedure;
```

```
process platform_id \in
PLATFORM_INDEX_START..PLATFORM_INDEX_END
variables plat_l_tlm_index = 0;
begin
\* populate platform tlm_info
plat00a: call platform_tlm_info_init ();
\* populate uobj tlm data
plat00b: call platform_uobj_tlm_data_init ();
\* set the boot-strap processor bsp flag for this platform
plat0a: cpu[CPU_INDEX_START + (self *
MAX_CPU_PER_PLATFORM)].bsp := TRUE;
\* set PC and CPL of boot-strap processor to for this platform
plat0b: cpu[CPU_INDEX_START + (self *
MAX_CPU_PER_PLATFORM)].pc :=
PLATFORM_CPU_PC_UOBJCOLL_ENTRY_SENTINEL_INIT;
\* plat0c: cpu[CPU_INDEX_START + (self *
MAX_CPU_PER_PLATFORM)].cpl :=
PLATFORM_CPU_CPL_UOBJCOLL; \* ""
\* boot the boot-strap processor for this platform
plat0d: cpu[CPU_INDEX_START + (self *
MAX_CPU_PER_PLATFORM)].state :=
PLATFORM_CPU_STATE_RUNNING_INIT;
plat2: while TRUE do
plat3: either
\* perform a DMA transaction
call platform_dma_actions ();
or
\* deliver external interrupt
call platform_gen_interrupt ();
end either;
end while;
end process;
```

```
process cpu_id \in CPU_INDEX_START..CPU_INDEX_END
begin
\* cpu process runs forever under the conditions within this while
pcpu0: while TRUE do
either
pcpu2: if cpu[self].state = PLATFORM_CPU_STATE_RUNNING_INIT then
\* debug harness
(*pcpu2a: if cpu[self].bsp then
pcpu2a1: print <<"cpu_id:", self, "BSP: TRUE">>;
else
pcpu2a2: print <<"cpu_id:", self, "BSP: FALSE">>;
end if;*)
pcpu2b: call uobjcoll_pc_actions ();
pcpu2c: call uobj_dma_pc_actions ();
pcpu2d: call uobj_smp_pc_actions ();
pcpu2e: call uobj_mmu_pc_actions ();
pcpu2f: call uobj_int_pc_actions ();
pcpu2g: call uobj_rtmrun_pc_actions ();
elsif cpu[self].state = PLATFORM_CPU_STATE_RUNNING_RUNTIME then
\* debug
assert
mmu_tlb[PLATFORM_CPU_MMU_UOBJCOLLSENTINELS_IDX].linear_addr_base =
UOBJCOLLSENTINELS_LINEAR_ADDR_BASE;
pcpu3a: call legacy_pc_actions ();
pcpu3b: call uobjcoll_pc_actions ();
pcpu3c: call uobj_int_pc_actions ();
pcpu3d: call uobj_uapp_pc_actions ();
elsif cpu[self].state = PLATFORM_CPU_STATE_HALTED then
pcpu4: skip;
elsif cpu[self].state = PLATFORM_CPU_STATE_SIPI then
pcpu5: skip;
else
\* invalid modeling state
assert FALSE;
end if;
or
\* generate CPU internal interrupts
call cpu_gen_interrupt (self, FALSE);
end either;
end while;
end process;
```

```
procedure uobj_uapp_pc_actions ()
variables uupa_l_temp = 0,
uupa_l_ch_element = [
uobj_id |-> 0,
pc |-> 0,
ret_uobj_id |-> 0,
ret_pc |-> 0
];
begin
uupa0: if cpu[self].pc = PLATFORM_CPU_PC_UOBJ_UAPP_INITIALIZE then
\* uapp uobj initialization
\* critical section
uupa1b: await uobjcoll_memory.uobjs[cpu[self].uobj_id].uobj_lock = 0;
uobjcoll_memory.uobjs[cpu[self].uobj_id].uobj_lock := 1;
call mmu_execute(PLATFORM_CPU_PC_UOBJ_UAPP_INITIALIZE_MAIN);
elsif cpu[self].pc = PLATFORM_CPU_PC_UOBJ_UAPP_PROCESSING then
\* uapp uobj processing
\* critical section
uupa2b: await uobjcoll_memory.uobjs[cpu[self].uobj_id].uobj_lock = 0;
uobjcoll_memory.uobjs[cpu[self].uobj_id].uobj_lock := 1;
call mmu_execute(PLATFORM_CPU_PC_UOBJ_UAPP_PROCESSING_MAIN);
elsif cpu[self].pc = PLATFORM_CPU_PC_UOBJ_UAPP_INTERRUPT then
\* uapp uobj interrupt
call mmu_execute(PLATFORM_CPU_PC_UOBJ_UAPP_INTERRUPT_MAIN);
elsif cpu[self].pc = PLATFORM_CPU_PC_UOBJ_UAPP_SHUTDOWN then
\* uapp uobj shutdown
\* critical section
uupa2c: await uobjcoll_memory.uobjs[cpu[self].uobj_id].uobj_lock = 0;
uobjcoll_memory.uobjs[cpu[self].uobj_id].uobj_lock := 1;
call mmu_execute(PLATFORM_CPU_PC_UOBJ_UAPP_SHUTDOWN_MAIN);
elsif cpu[self].pc = PLATFORM_CPU_PC_UOBJ_UAPP_INITIALIZE_MAIN then
\* uapp uobj initialize_main
uupa2d: either
call uobj_pc_action_logic_data_access ( {
UOBJ_PC_ACTION_LOGIC_DATA_ACCESS_INCLUDE_DATA_READ,
UOBJ_PC_ACTION_LOGIC_DATA_ACCESS_INCLUDE_DATA_WRITE,
} );
```

```
or
call uobj_pc_action_logic_control_xfer ( {
UOBJ_PC_ACTION_LOGIC_CONTROL_XFER_INCLUDE_SELFINITIALIZE,
UOBJ_PC_ACTION_LOGIC_CONTROL_XFER_INCLUDE_SELFSHUTDOWN,
UOBJ_PC_ACTION_LOGIC_CONTROL_XFER_INCLUDE_RETURN
} );
or
call uobj_pc_action_logic_legacycontrol_xfer (
{UOBJ_PC_ACTION_LOGIC_LEGACYCONTROL_XFER_INCLUDE_LEGACYCALL}
);
end either;
elsif cpu[self].pc = PLATFORM_CPU_PC_UOBJ_UAPP_INTERRUPT_MAIN then
\* uapp uobj interrupt_main
uupa6a: either
call uobj_pc_action_logic_data_access ( {
UOBJ_PC_ACTION_LOGIC_DATA_ACCESS_INCLUDE_DATA_READ,
UOBJ_PC_ACTION_LOGIC_DATA_ACCESS_INCLUDE_LOCALDATA_READ,
} );
or
call uobj_pc_action_logic_control_xfer ( {
UOBJ_PC_ACTION_LOGIC_CONTROL_XFER_INCLUDE_INTRETURNPOP
} );
end either;
else
\* this is not a uapp uobj pc action, so just fall through
skip;
end if;
uupa: return;
end procedure;
```

```
procedure cpu_gen_interrupt ( p_cgi_cpu_id, p_cgi_external_interrupt )
variables l_cgi_ivt_index = [ i \in CPU_INDEX_START..CPU_INDEX_END |-> 0 ];
begin
cgi1: with l_cgi_ivt_index_temp \in 0..MAX_PLATFORM_CPU_IVT_ENTRIES-1 do
l_cgi_ivt_index := l_cgi_ivt_index_temp;
end with;
cgi2: if (p_cgi_external_interrupt) then
\* generate external interrupt
cgi2a: if cpu[p_cgi_cpu_id].ivt_id_gen_external =
PLATFORM_CPU_IVT_INVALID_IDX then
cpu[p_cgi_cpu_id].ivt_id_gen_external := l_cgi_ivt_index;
end if;
else
\* generate internal interrupt
cgi2b: if cpu[p_cgi_cpu_id].ivt_id_gen_internal =
PLATFORM_CPU_IVT_INVALID_IDX then
cpu[p_cgi_cpu_id].ivt_id_gen_internal := l_cgi_ivt_index;
end if;
end if;
cgi: return;
end procedure;
```

```
procedure platform_gen_interrupt ()
variables l_pgi_cpu_index = [ p \in
PLATFORM_INDEX_START..PLATFORM_INDEX_END |->
CPU_INDEX_INVALID
];
begin
\* choose a CPU that belongs to this platform
pgi1: with l_pgi_cpu_index_temp \in (CPU_INDEX_START + (self *
MAX_CPU_PER_PLATFORM))..(CPU_INDEX_START + (self *
MAX_CPU_PER_PLATFORM) + (MAX_CPU_PER_PLATFORM-1)) do
l_pgi_cpu_index := l_pgi_cpu_index_temp;
end with;
\* trigger an external interrupt on that CPU
pgi2: call cpu_gen_interrupt ( l_pgi_cpu_index, TRUE);
pgi: return;
end procedure;
```

FIG. 13B

```
procedure cpu_process_interrupt ()
begin                                                              1303
cpi1: either
\* process internal interrupt
cpi2: if ~(cpu[self].ivt_id_gen_internal = PLATFORM_CPU_IVT_INVALID_IDX) then
\* only generate interrupts if CPU interrupt enable flag is set
cpi3: if (cpu[self].cpl = PLATFORM_CPU_CPL_LEGACY \land
cpu_ivt[cpu[self].ivt_id_gen_internal].ivt_pc_cpl = PLATFORM_CPU_CPL_LEGACY \land
cpu[self].interrupt_enable_legacy = TRUE) \lor \* TODO : ADD (check other CPL)
(cpu[self].cpl = PLATFORM_CPU_CPL_UOBJCOLL \land
cpu_ivt[cpu[self].ivt_id_gen_internal].ivt_pc_cpl = PLATFORM_CPU_CPL_UOBJCOLL \land
cpu[self].interrupt_enable_uobjcoll = TRUE)
then
\*cpi4: if ~ (cpu_ivt[cpu[self].ivt_id_gen_internal].ivt_rpl = cpu[self].cpl) then
\* TBD: handle error exception
\*cpi4a: skip;
\*else
cpi4b: cpu[self].ivt_id := cpu[self].ivt_id_gen_internal;
cpi4b0: cpu[self].ivt_id_is_external := FALSE;
cpi4c: call mmu_execute(cpu_ivt[cpu[self].ivt_id_gen_internal].ivt_pc);
cpi4d: cpu[self].cpl := cpu_ivt[cpu[self].ivt_id_gen_internal].ivt_pc_cpl; \* TODO : should be redundant
\*end if;
end if;
end if;
or
\* process external interrupt
cpi5: if ~(cpu[self].ivt_id_gen_external = PLATFORM_CPU_IVT_INVALID_IDX) then
\* only generate interrupts if CPU interrupt enable flag is set
cpi6: if (cpu[self].cpl = PLATFORM_CPU_CPL_LEGACY \land
cpu_ivt[cpu[self].ivt_id_gen_external].ivt_pc_cpl = PLATFORM_CPU_CPL_LEGACY \land
cpu[self].interrupt_enable_legacy = TRUE) \lor \* TODO : ADD (check other CPL)
(cpu[self].cpl = PLATFORM_CPU_CPL_UOBJCOLL \land
cpu_ivt[cpu[self].ivt_id_gen_external].ivt_pc_cpl = PLATFORM_CPU_CPL_UOBJCOLL \land
cpu[self].interrupt_enable_uobjcoll = TRUE)
then
\*cpi7: if ~ (cpu_ivt[cpu[self].ivt_id_gen_external].ivt_rpl = cpu[self].cpl) then
\* TBD: handle error exception
\* cpi7a: skip;
\*else
cpi7b: cpu[self].ivt_id := cpu[self].ivt_id_gen_external;
cpi7b0: cpu[self].ivt_id_is_external := TRUE;
cpi7c: call mmu_execute(cpu_ivt[cpu[self].ivt_id_gen_external].ivt_pc);
cpi7d: cpu[self].cpl := cpu_ivt[cpu[self].ivt_id_gen_external].ivt_pc_cpl;
\*end if;
end if;
end if;
end either;
cpi: return;
end procedure;
```

```
procedure legacy_pc_actions ()
variables lpa_l_temp = 0,
lpa_l_uobjcoll_pc = PLATFORM_CPU_PC_INVALID
;
begin
lpa0: if cpu[self].pc = PLATFORM_CPU_PC_LEGACY then
lpa1a: assert cpu[self].cpl = PLATFORM_CPU_CPL_LEGACY;
lpa1b: assert cpu[self].state = PLATFORM_CPU_STATE_RUNNING_RUNTIME;
either
\* memory read from legacy area
call mmu_load(PLATFORM_CPU_MMU_LEGACY_IDX,
PLATFORM_CPU_MMU_LEGACY_IDX_QUAL_LEGACYDATA, 0,0,0,0,0,0,0,0);
lpa2a: lpa_l_temp := mmu_load_return[self];
or
\* memory write to legacy area
call mmu_store(PLATFORM_CPU_MMU_LEGACY_IDX,
PLATFORM_CPU_MMU_LEGACY_IDX_QUAL_LEGACYDATA,
lpa_l_temp, 0, 0, 0, 0, 0, 0, 0);
or
\* memory execute to legacy area
call mmu_execute(PLATFORM_CPU_PC_LEGACY);
or
\* memory read from uobjcoll area
call mmu_load(PLATFORM_CPU_MMU_UOBJCOLL_IDX,
PLATFORM_CPU_MMU_UOBJCOLL_IDX_QUAL_UOBJ_DATA_READ,
0,0,0,0,0,0,0);
lpa2b: lpa_l_temp := mmu_load_return[self];
or
\* memory write to uobjcoll area
call mmu_store(PLATFORM_CPU_MMU_UOBJCOLL_IDX,
PLATFORM_CPU_MMU_UOBJCOLL_IDX_QUAL_UOBJ_DATA_WRITE,
lpa_l_temp, 0, 0, 0, 0, 0, 0);
or
\* memory execute to uobjcoll area
lpa2b0: with lpa_l_target_uobjcoll_pc \in PC_UOBJ_MIN..PC_UOBJ_MAX \union
PLATFORM_CPU_PC_UOBJCOLL_EXIT_SENTINEL_PC_SET do
lpa_l_uobjcoll_pc := lpa_l_target_uobjcoll_pc;
end with;
call mmu_execute(lpa_l_uobjcoll_pc);
```

FIG. 14A

1402 or
\* memory read from uobjcolltlm area
call mmu_load(PLATFORM_CPU_MMU_UOBJCOLLTLM_IDX, 0, 0,0,0,0,0,0,0,0);
lpa2c: lpa_l_temp := mmu_load_return[self];
or
\* memory write to uobjcolltlm area
call mmu_store(PLATFORM_CPU_MMU_UOBJCOLLTLM_IDX, 0,
lpa_l_temp, 0, 0, 0, 0, 0, 0, 0);
or
\* memory execute to uobjcolltlm area
call mmu_execute(PLATFORM_CPU_PC_MMU_UOBJCOLLTLM_IDX);
or
\* memory read from uobjcolltlmdma area
call mmu_load(PLATFORM_CPU_MMU_UOBJCOLLTLMDMA_IDX, 0, 0,0,0,0,0,0,0,0);
lpa2d: lpa_l_temp := mmu_load_return[self];
or
\* memory write to uobjcolltlmdma area
call mmu_store(PLATFORM_CPU_MMU_UOBJCOLLTLMDMA_IDX, 0,
lpa_l_temp, 0, 0, 0, 0, 0, 0, 0);
or
\* memory execute to uobjcolltlmdma area
call mmu_execute(PLATFORM_CPU_PC_MMU_UOBJCOLLTLMDMA_IDX);
or
\* memory read from uobjcolldma area
call mmu_load(PLATFORM_CPU_MMU_UOBJCOLLDMA_IDX, 0, 0,0,0,0,0,0,0,0);
lpa2e: lpa_l_temp := mmu_load_return[self];
or
\* memory write to uobjcolldma area
call mmu_store(PLATFORM_CPU_MMU_UOBJCOLLDMA_IDX, 0,
lpa_l_temp, 0, 0, 0, 0, 0, 0, 0);
or
\* memory execute to uobjcolldma area
call mmu_execute(PLATFORM_CPU_PC_MMU_UOBJCOLLDMA_IDX);
or
\* memory read from uobjcollsentinels area
call mmu_load(PLATFORM_CPU_MMU_UOBJCOLLSENTINELS_IDX, 0,
0,0,0,0,0,0,0,0);
lpa2f: lpa_l_temp := mmu_load_return[self];
or
\* memory write to uobjcollsentinels area
call mmu_store(PLATFORM_CPU_MMU_UOBJCOLLSENTINELS_IDX, 0,
lpa_l_temp, 0, 0, 0, 0, 0, 0, 0);
\* note on sentinel executions below: EXIT_SENTINEL PCs are considered
\* to be part of uobjcoll area and handled above as part of uobjcoll
\* execute actions

FIG. 14B

```
or
\* memory execute to INIT sentinel
call mmu_execute(PLATFORM_CPU_PC_UOBJCOLL_ENTRY_SENTINEL_INIT);
or
\* memory execute to PMCALL sentinel
call mmu_execute(PLATFORM_CPU_PC_UOBJCOLL_ENTRY_SENTINEL_PMCALL);
or
\* memory execute to LEGACYRESUME sentinel
call
mmu_execute(PLATFORM_CPU_PC_UOBJCOLL_ENTRY_SENTINEL_LEGACYRET);
or
\* interrupt reflection to uobjcoll
\* memory execute to
PLATFORM_CPU_PC_UOBJCOLL_ENTRY_SENTINEL_INTCALL
call mmu_execute(PLATFORM_CPU_PC_UOBJCOLL_ENTRY_SENTINEL_INTCALL);
or
\* generate interrupt
call cpu_process_interrupt ();
end either;
else
\* this is not a LEGACY pc action, so just fall through
skip;
end if;
lpa: return;
end procedure;
```

```
\* a uobject can only read and/or write to uobject data within bounds
MS_Inv_1 == \A p \in CPU_INDEX_START..CPU_INDEX_END :
cpu[p].uobj_id # UOBJ_INVALID_IDX
=>
/\ uobjcoll_memory.uobjs[cpu[p].uobj_id].uobj_dmadata # <<cpu[p].uobj_id,
UOBJ_INTENT_DATA_READ>>
/\ uobjcoll_memory.uobjs[cpu[p].uobj_id].uobj_dmadata # <<cpu[p].uobj_id,
UOBJ_INTENT_DATA_WRITE>>
/\ \/ /\ uobjcoll_memory.uobjs[cpu[p].uobj_id].uobj_tlmdata[2] #
UOBJ_INTENT_DATA_READ
   /\ uobjcoll_memory.uobjs[cpu[p].uobj_id].uobj_tlmdata[2] #
UOBJ_INTENT_DATA_WRITE
\/ uobjcoll_memory.uobjs[cpu[p].uobj_id].uobj_tlmdata[1] # cpu[p].uobj_id
/\ uobjcoll_memory.uobjs[cpu[p].uobj_id].uobj_intdata # <<cpu[p].uobj_id,
UOBJ_INTENT_DATA_READ>>
/\ uobjcoll_memory.uobjs[cpu[p].uobj_id].uobj_intdata # <<cpu[p].uobj_id,
UOBJ_INTENT_DATA_WRITE>>
\* For all uobjects no two uobjects have same secure-device TLM allocated to it
MS_Inv_7 == \A i \in 0..(MAX_UOBJS-1):
\A j \in (0..(MAX_UOBJS-1) \ {i}):
uobjcoll_memory.uobjs[i].uobj_tlmdata[3] \intersect
uobjcoll_memory.uobjs[j].uobj_tlmdata[3] = {}
```

```
\* A uobject can only read and/or write to uobject data within an exclusive lock for
\* all parallel execute of üobject public method.
MS_Inv_8 == \A self \in CPU_INDEX_START..CPU_INDEX_END:
/\ cpu[self].uobj_id # UOBJ_INVALID_IDX
/\ uobjcoll_memory.uobjs[cpu[self].uobj_id].uobj_data = <<cpu[self].uobj_id,
UOBJ_INTENT_DATA_WRITE>>
=>
uobjcoll_memory.uobjs[cpu[self].uobj_id].uobj_lock = 1

\* no entity outside of an uobject accesses uobject int-data
MI_Inv_2 == \A id \in 0..(MAX_UOBJS-1):
\A p \in CPU_INDEX_START..CPU_INDEX_END:
/\ \/ uobjcoll_memory.uobjs[id].uobj_intdata[1] = -1
   \/ uobjcoll_memory.uobjs[id].uobj_intdata[1] = id
/\ cpu[p].uobj_id # UOBJ_INVALID_IDX
=>
cpu[p].uobj_id \in 0..(MAX_UOBJS -1)

\* legacy code always executes in legacy mode
PS_Inv_2 == \A p \in CPU_INDEX_START..CPU_INDEX_END :
cpu[p].pc = PLATFORM_CPU_PC_LEGACY
=>
cpu[p].cpl = PLATFORM_CPU_CPL_LEGACY \* Either CPU::mmu-enable is FALSE or CPU::mmu-enable is TRUE and üobject
collection memory is mapped
\* in a disjoint (non-overlapping) manner.
CFI_Inv_1 == \A self \in CPU_INDEX_START..CPU_INDEX_END :
\A entry \in 1..PLATFORM_CPU_MMU_MAX_IDX-1:
cpu[self].mmu_enabled
=>
/\ mmu_tlb[entry-1].linear_addr_base + mmu_tlb[entry-1].linear_addr_size - 1 <
mmu_tlb[entry].linear_addr_base
/\ mmu_tlb[entry-1].physical_addr_base + mmu_tlb[entry-1].physical_addr_size - 1 <
mmu_tlb[entry].physical_addr_base \* Control flow may only move from legacy to uobjects via uobjcollection sentinels
CFI_Inv_5 == \A self \in CPU_INDEX_START..CPU_INDEX_END :
cpu[self].pc \in PC_UOBJ_MIN..PC_UOBJ_MAX
=>
cpu[self].pc_prev # PLATFORM_CPU_PC_LEGACY
```

```
* üobject collection pmret exit-sentinel sets
\* up CPU::sp to point to legacy execution stack and
\* sets CPU:: privilege-level to legacy before transferring
\* control to legacy code
CFI_Inv_11 == \A i \in CPU_INDEX_START..CPU_INDEX_END :
cpu[i].pc_prev = PLATFORM_CPU_PC_UOBJCOLL_EXIT_SENTINEL_PMRET
=>
/\ cpu[i].cpl = PLATFORM_CPU_CPL_LEGACY
/\ cpu[i].sp = PLATFORM_CPU_SP_LEGACY
/\ cpu[i].pc = PLATFORM_CPU_PC_LEGACY \* CPU::int is false (i.e. interrupts are disabled)
\* OR CPU::int is true and CPU setup to execute üobject
\* collection intcall entry-sentinel at privilege level of uobjcoll
\* for all interrupts that
\* are handled by the üobject collection
CFI_Inv_15 == \A i \in 1..MAX_PLATFORM_CPU_IVT_ENTRIES-1:
\E p \in CPU_INDEX_START..CPU_INDEX_END :
cpu[p].interrupt_enable_uobjcoll = TRUE
=>
/\ cpu_ivt[i].ivt_pc = PLATFORM_CPU_PC_UOBJCOLL_ENTRY_SENTINEL_INTCALL
/\ cpu_ivt[i].ivt_pc_cpl = PLATFORM_CPU_CPL_UOBJCOLL
```

```
THEOREM (*\E self \in 1..MAXCPUS :*)
Cpu \in [1..MAXCPUS ->
[Id : 1..MAXCPUS, Pc : [1..2 -> 0..5], Pr : 0..3,
Collection : 0..MAXUOBJCOLLECTIONS,
Object : 0..MAXUOBJSWITHINCOLLECTION]] \*/\
\*\A i \in ProcSet \ {self} : UNCHANGED Cpu[i]
=>
\E self \in 1..MAXCPUS :
[Cpu EXCEPT
![self] = [Cpu[self] EXCEPT !.Pc = [Cpu[self].Pc EXCEPT ![2] = 3]]]
\in [1..MAXCPUS ->
[Id : 1..MAXCPUS, Pc : [1..2 -> 0..5], Pr : 0..3,
Collection : 0..MAXUOBJCOLLECTIONS,
Object : 0..MAXUOBJSWITHINCOLLECTION]]
BY mcT\*constants\* DEF ProcSet
THEOREM Cpu \in [1..MAXCPUS -> [Pc : [1..2 -> 0..5]]] => \E self \in 1..MAXCPUS:
```

[Cpu EXCEPT
![self] = [Cpu[self] EXCEPT !.Pc = [Cpu[self].Pc EXCEPT ![2] = 3]]]
\in [1..MAXCPUS -> [Pc : [1..2 -> 0..5]]]
BY constants
THEOREM \A self \in 1..MAXCPUS:
saved_pc[self] \in 0..3 =>
[procedure |-> "Uobject_code_legacy_func", pc |-> "CS_Loop",
saved_pc |-> 0(*saved_pc[self]*)]
\in [procedure : {"Cpu_process", "memory_store", "memory_load",
"Uobject_code_legacy_func", "Uobject_code",
"Uobjcollection_code", "Legacy_code"},
pc : {"Done", "CS_Loop", "End_Col", "Loop_Legacy", "End_Process"},
(*c : 0..MAXUOBJCOLLECTIONS, o : 0..MAXUOBJSWITHINCOLLECTION,
l : BOOLEAN, val : {0}, c_ : 0..MAXUOBJCOLLECTIONS,
o_ : 0..MAXUOBJSWITHINCOLLECTION, l_ : BOOLEAN,*) saved_pc : 0..3,
saved_pc_ : 0..3(*, saved_pc_U : 0..3, saved_pc_Uo : 0..3,
In_uobj : BOOLEAN, Uobj_finished : BOOLEAN*)]
OBVIOUS
THEOREM [procedure |-> "Uobject_code_legacy_func",
pc |-> "CS_Loop",
saved_pc |-> 0(*saved_pc[0]*),
c |-> 0,
o |-> 0,
l |-> FALSE,
val |-> 0,
c_ |-> 0,
o_ |-> 0,
l_ |-> FALSE,
saved_pc_ |-> 0,
saved_pc_U |-> 0,
saved_pc_Uo |-> 0,
In_uobj |-> FALSE,
Uobj_finished |-> FALSE] \in StackEntry
BY constants, saved_pc[0] \in 0..3 DEF StackEntry

FIG. 16B

SYSTEMS AND METHODS FOR FORMAL VERIFICATION OF COMPUTER PLATFORMS

RELATED APPLICATIONS

This application claims the benefit under 35 U.S.C. 119(e) of U.S. Provisional Application No. 63/727,719 filed on Dec. 4, 2024, which is incorporated herein in its entirety.

TECHNICAL FIELD

The present disclosure relates to at least the field of design of computer platforms including cybersecurity.

BACKGROUND ART

The subject matter discussed in the background section should not be considered prior art merely because of its mention in the background section. Similarly, a problem mentioned in the background section or associated with the subject matter of the background section should not be considered to have been previously recognized in the prior art. The subject matter in the background section merely represents different approaches, which in and of themselves, may also correspond to claimed embodiments.

Cyberattacks are an ever-present risk associated with modern computer platforms. Maintaining cybersecurity is a challenge for individuals, businesses, government and other organizations.

In U.S. Pat. No. 8,627,414 issued Jan. 7, 2014, inventors McCune et al. disclose a computer including a processor and a verification device. The processor in the computer performs the steps of authenticating a secure connection between a hypervisor and the verification device, measuring the identity of at least a portion of a select guest before the select guest executes any instruction, and sending a measurement of the identity of the select guest to the verification device. The verification device compares the policy stored in the verification device with the measurement of the select guest received by the verification device. The steps of authenticating, measuring, sending, and comparing are performed after receiving a signal indicative of a request to execute the selected guest and without rebooting the computer.

In U.S. Pat. No. 12,093,367 issued Sep. 17, 2024, inventor Amit Vasudevan discloses a system architecture that structures commodity heterogeneous interconnected computer platforms around universal object abstractions, which are a fundamental system abstraction and building block that provides practical and provable end-to-end guarantees of security, correctness, and timeliness for the platform.

SUMMARY

Systems and methods for mathematical modeling of the hardware and software stack of commodity computer platforms are provided, enabling provable guarantees on memory, device, and program execution. This approach addresses the technical problem of reliance on system agents that rely on implicit trust in the operating environment, which can be exploited by sophisticated attackers using complex threats such as memory access exploits and code/data integrity exploits. The solution provides a proactive, mathematically-backed security solution that eliminates entire classes of cyberattacks by design, ensuring realizable guarantees on commodity computer platforms running hardware and software stack elements at the lowest operating level. This approach has significant advantages over current reactive cybersecurity methods, including reduced complexity and overhead, and increased confidence in the integrity of the system. The solution's main uses include providing mathematically-backed security and availability guarantees for critical infrastructure, financial institutions, and other organizations vulnerable to cyberattacks.

One aspect relates to a system for providing formal verification of a design and operation of a computer platform, the system comprising at least one processor; and at least one computer-readable storage medium having stored thereon instructions which, when executed, program the at least one processor to perform act(s) of evaluating a mathematical model that defines interfaces to hardware elements and software stack elements of the computer platform, encodes operational aspects of the hardware elements and software stack elements using the interfaces, and specifies invariants with assume-guarantee interface-confined mathematical reasoning, wherein the evaluating determines whether the invariants hold throughout the lifetime of the computer platform.

In some embodiments, the mathematical model is defined in one or more mathematical logic languages. In some embodiments, the hardware elements and software stack elements of the computer platform comprise memory, peripherals, computing processors and program execution elements. In some embodiments, a peripheral among the peripherals is a validated computer platform. In some embodiments, the interfaces include a direct memory access (DMA) interface; the mathematical model specifies at least one peripheral among the peripherals that accesses the memory via the DMA interface; the DMA interface is governed by one or more DMA access control tables and/or channels which specify access control permissions of said peripheral to access specified regions of the memory; and the DMA access control table and/or channels is implemented in hardware and programmable via software source or binary embedding within the program execution element, wherein the DMA interface is modeled via mathematical process calculi logic allowing for multiple hardware elements to access the DMA interface concurrently in the computer platform.

the computer platform is a first computer platform and the mathematical model is a first mathematical model, the at least one computer-readable storage medium further has stored thereon instructions which, when executed, program the at least one processor to perform additional acts of evaluating a second mathematical model for a second computer platform; and if the invariants hold for both the first and second computer platform, determining that a combined computer platform, consisting of both the first and second computer platform, is validated.

In some embodiments, at least one of the invariants is a security property. In some embodiments, the security property is selected from the group consisting of control-flow integrity, memory safety, memory-integrity, privilege separation, and approved execution, and authorized data encryption and decryption.

In some embodiments, the invariants specified by the mathematical model include at least one liveness property that is used to describe availability of a platform resource.

In some embodiments, the invariants specified by the mathematical model are formulated using the interfaces.

In some embodiments, determining from the mathematical model whether the invariants hold throughout the lifetime of the computer platform comprises analyzing the invariants to determine whether a model system property (MSP) is satisfied. In some embodiments, analyzing the invariants to determine whether the MSP is satisfied comprises encoding the invariants into a computer-assisted theorem proving system and using the computer-assisted theorem proving system to analyze the invariants to determine if the MSP is satisfied. In some embodiments, the at least one computer-readable storage medium further has stored thereon instructions which, when executed, program the at least one processor to perform additional act(s) of, if the MSP is found not to be satisfied, generating a counterexample that shows that the MSP does not hold for an operational aspect among the operational aspects of the computer platform.

In some embodiments, the mathematical model further defines an operational state space for the computer platform; and determining from the mathematical model whether the invariants hold throughout the lifetime of the computer platform comprises determining if a state in the operational state space can be reached from an initial state for all possible state transitions of the mathematical model.

Another aspect relates to a computer-implemented method for mathematical modeling of hardware elements and software stack elements of a computer platform to provide provable guarantees on memory, device and program execution. A mathematical model of the computer platform defines operational aspects of the platform hardware elements and software stack elements. The platform hardware elements and software stack elements may include, for example, platform memory, peripherals, computing processors and program execution elements. The mathematical model may be in a mathematical logic 302 language. Interfaces are defined to the platform memory, peripherals, computing processors and program execution elements. Guarantees are defined via invariants with assume-guarantee interface-confined mathematical reasoning that should hold throughout the lifetime of the computer platform execution.

The mathematical model of the computer platform may allow building a Type-system to track precise data types across the program execution elements. This may allow modeling the program execution elements down to the granularity of function calls and instructions therein. The mathematical model may have predicates that can be translated to proof obligations which can be interpreted and verified by automated and/or interactive theorem provers 850.

The invariants used to specify guarantees can be, for example, (1) security invariants which are used to describe a security property (e.g., memory safety, memory-integrity, control-flow integrity, privilege separation, approved execution, and authorized data encryption and decryption); (2) a liveness property which is used to describe availability of a particular resource of the computer platform; or (3) formulated using the modeling interfaces for memory, peripheral, computing processors and program execution elements.

The mathematical invariants may be analyzed to determine whether a model system property (MSP 601) for either a security property or a liveness property of the computer platform is satisfied. The MSP 601 may, for example, relate to a compliance with a cybersecurity regulation applicable to the computing platform. The analysis may include, for example, encoding the invariants into a computer-assisted theorem proving system and using the computer-assisted theorem proving system to analyze the mathematical invariants to determine if the MSP 601 is satisfied. The mathematical invariants may be analyzed to generate a counterexample that shows that an MSP 601 does not hold for an operational aspect of the computer platform. The counterexample may show that the operational aspect of the commodity computer platform is not in compliance with an applicable cybersecurity regulation. The mathematical invariants may be analyzed to determine if a particular state (in terms of function and/or instruction) in an operational state space for the computer platform can be reached from an initial state for all possible state transitions of the model.

The mathematical invariants may be analyzed to determine whether the MSP 601 for the security property and/or liveness property of the computer platform is satisfied by encoding the invariants into a computer-assisted theorem proving system and using the computer-assisted theorem proving system to analyze the mathematical invariants to determine if the MSP 601 is satisfied.

The mathematical model of the computer platform may define operational aspects of the hardware elements and software stack elements via program execution elements running on one or more computing processors of the platform. The atomic execution units of the program execution elements may be functions and instructions within functions. The instructions may access platform memory and peripherals through prescribed interfaces. Such access may be for loading data, storing data, and executing other functions and instructions of program execution elements. The program execution elements can run on a common processor or be spread across different processors.

The mathematical model of the computer platform may define peripherals accessing platform memory via a direct memory access (DMA) interface. The DMA interface may be governed by one or more DMA control tables 220 that configure one or more access control channels 230 which specify the access control permissions of the peripheral to access specified memory regions. The DMA control tables 220 and access control channels 230 may be implemented, for example, in computer platform hardware and programmable via software source or binary embedding within the program execution element. DMA may be modeled via mathematical process calculi 270 logic allowing for multiple peripherals to access DMA concurrently in the computer platform. The peripherals specified in the mathematical model of the computer platform may itself be a computing platform which can be modeled by these methods. Thus, a computer platform can include within itself other units that are also computer platforms.

MSP 601 may be realized on the program execution element implementation via hardware capabilities offered by the underlying computer platform. The MSP 601 may be realized on the program execution element implementation via modifications to the program execution element source code which is eventually compiled to the program element binary instructions or via modifications to the program element binary directly.

The mathematical model of the computer platform may model the platform memory. The platform memory may have one or more address spaces at one or more privilege levels. The mathematical model may specify memory interfaces for reading and writing to memory to accommodate for data load and store. The mathematical model may specify memory interface for executing to memory to accommodate for instruction level fetches for code execution. The memory may be modeled via region based mappings with support for multiple words and pointers via a combination of Hoare logic and separation logic. The mathematical model of the memory may allow mapping into the underlying computer platform processor architecture (e.g., total store order, weak memory model). The mathematical model of the memory may include an access control matrix for access control of memory regions at a given address space and privilege level. The access control matrix may be implemented in hardware, via software source or binary embedding within the program execution element or a combination of the two. A translation look-aside buffer (TLB) may be used to allow modeling of memory region address caching. The mathematical model of the memory may be extended to a function as one or more cache memory and/or one or more regular system memory, or to function as one or more memory allocator program elements (e.g., heap or stack allocators).

The mathematical model of the computer platform may model the computing processor as capable of operating on a given memory address space choosing from one or more supported address spaces. A boot-strap processor may signal other processors to begin execution at a given address within an address space. The computing processor may be modeled as executing instructions from memory via the memory execute interface within an address space. The computing processor may be modeled in the mathematical model as executing instructions for load and store via the memory read and write interfaces for an address space. The computing processor may be modeled in the mathematical model via mathematical process calculi 270 logic allowing for one or more processors to execute instructions concurrently.

The model of a processor executing instructions model program element execution on the commodity computer platform software stack; wherein processor executing instructions can span one or more program execution elements in one or more memory address spaces; there are one or more initialization phases and a runtime phase comprising one or more program elements, per memory address space; the location of the current program execution element is tracked via a per-processor program counter variable for a given memory address space; invocation across program execution elements is modeled via non-deterministic finite automaton using the processor program counter. The program execution element model may include one or more memory regions that are mapped into a given memory address space. These memory regions may encompass program element code, global data, heap and stack in addition to other program element specific memory regions.

The model of a processor executing instruction modeling program element execution on the computer platform software stack may maintain a stack for the program execution elements and a location of the stack via a per-processor stack pointer variable.

The program element model may allow caller programing elements invoking other callee program elements, wherein the caller and callee are in the same address space, caller and callee are in different address spaces, the call between a caller and a callee program element is governed by one or more calling access control matrix which may either allow or deny the call; and/or the access control matrix is implemented in hardware, via software source or binary embedding within the program element or a combination of the two.

The program element invocation modeling may employ the program element stack and processor stack pointer to track call frames and nested invocation.

The mathematical model of the computer platform may define adversarial actions. The adversarial actions may be embedded in the mathematical model and can refer to program execution functions. The adversarial actions may be embedded in the mathematical model and can refer to instructions or memory load and store. The adversarial actions may be embedded in the mathematical model and can refer to peripheral DMA and interrupts delivered to the computer platform.

The invariants may be analyzed to determine whether the MSP 601 for either the security property and/or liveness property of the computer platform is satisfied in the presence of adversarial actions. The analysis may include encoding the invariants into a computer-assisted theorem proving system. The analysis may include using the computer-assisted theorem proving system to analyze the invariants to determine if the MSP 601 is satisfied.

The mathematical model of the computer platform may define interrupt modeling. The interrupt modeling may include one or more interrupt vector table data structures per processor initialized to one or more program execution elements. The interrupt modeling may include interrupt generation to generate interrupts on one or more processors within the platform ("platform_gen_interrupt"). The interrupt modeling may include processor interrupt signaling to signal interrupts on a given processor ("cpu_gen_interrupt"). The interrupt modeling may include processor interrupt processing to process interrupts on one or more processors within the platform (cpu_process_interrupt). The interrupt vector table may be modeled as a mathematical tuple consisting of identifier, caller program element privilege level, program counter, and interrupt privilege level. The interrupt modeling may include platform interrupt generation where a set of processors is selected from the number of processors in the platform via mathematical non-deterministic finite automata modeling. The interrupt modeling may include platform interrupt generation where a set of interrupt vectors are selected from a tuple of internal or external interrupts via mathematical non-deterministic finite automata modeling. The interrupt modeling may include platform interrupt generation where the set of processors is mapped to the set of interrupt vectors via mathematical non-deterministic finite automata modeling. The selected processors may then be signaled for an interrupt with the corresponding interrupt vector and interrupt type (external or internal) via mathematical process calculi 270. The interrupt modeling may include modeling processor interrupt signaling where modeling interrupt signaling consists of modeling internal processor interrupt handling. The modeling interrupt signaling may include modeling external processor interrupt handling. The modeling interrupt signaling may include modeling error handling for undefined interrupts.

Modeling processor interrupt signaling may include setting processor interrupt status to internal, external or error with the processor interrupt vector set to the interrupt vector. The interrupt modeling may include modeling processor interrupt processing. Modeling interrupt processing may include modeling internal interrupt processing and external interrupt processing. Modeling internal and external interrupt processing may involve setting the processor program counter to the program execution element program counter programmed in the processor interrupt vector table for the given interrupt vector only if the processor is not processing an interrupt presently. Modeling internal and external interrupt processing may include saving the current processor program counter where the program execution element is being interrupted, switching the program execution element stack to one or more interrupt stacks and updating the processor stack pointer variable, Modeling the execution of the program element interrupt handling, switching back to one or more program element stack from the interrupt stack and updating the processor stack pointer variable, and resuming control at the processor program counter at which the program execution element was interrupted.

The mathematical model of the computer platform may define computer-implemented model proof tactics to produce computer-implemented mathematical induction proofs for invariants for system model properties. The computer-implemented model proof tactics may include isolating individual proof obligations and proving with a minimized environment using rewriting and hiding. The computer-implemented model proof tactics may include full decomposition of invariant proof including all possible disjunction reduction and automatic inclusion of necessary facts and definitions. The computer-implemented model proof tactics may include automatic proof-obligation checking with ascending timeouts of unverified obligations. The computer-implemented model proof tactics may include a library of previously verified proof-obligations for reuse. The computer-implemented model proof tactics may include using type for model execution path location, for processor program counter, processor stack pointer and program element stack types. The computer-implemented model proof tactics may include basic tactics such as (1) automatically evaluating model constants and arithmetic/set relations; (2) adding automatic model variable unchanged checks where needed and all model variable non-self-unchanged checks for process-indexed target model variable alteration; (3) rewriting model record definitions to directly set the new value; (4) decomposing all model record declarations; (5) editing entries in program element stack modeling to have consistent types; and (6) removal of unnecessary stack frame retrieval for program execution element stack modeling.

The computer-implemented model proof tactics may comprise model variable tactics where (1) computer-implemented model variable tactics comprises removal of out-of-scope reference/alterations of model variables; (2) computer-implemented model variable tactics comprises adding in model variables of interest and their types for each lemma; (3) model variable tactic comprise writing types for all target variables or variables they touch; (4) model variable tactic uses reverse traversal for model value and determines location set where it holds (5) model variable tactic creates full control flow graph tracking target model variables and relevant state, or ad-hoc create smaller graphs working back to all alterations of target variables; (6) model variable tactic creates a graph to work back to all alterations of target variables; (7) model variable tactic automatically generates lemma when a target variable set to other variable value; (8) model variable tactic comprises variable value analysis by adding type checking on all steps in paths between target locations for a variable and its preceding alterations; (9) model variable tactic comprises using variable types when doing inclusions or comparisons; and/or (10) computer-implemented model proof tactics comprises adding invisible history/prophecy variables to model and verify they are consistent with the model.

The computer-implemented mathematical induction proofs corresponding to the mathematical invariants may be analyzed by analyzing the computer-implemented mathematical induction proofs to determine whether the MSP 601 for the computing platform is satisfied, and upon a determination that the MSP 601 is not satisfied, analyzing the computer-implemented mathematical induction proofs to generate a counter example that shows that the MSP 601 does not hold for the commodity computing platform program execution. Analyzing the computer-implemented mathematical induction proofs corresponding to the mathematical invariants may be done to determine whether the MSP 601 for either the security property and/or the liveliness property of the computer platform is satisfied. The analysis may include encoding the mathematical induction proofs into a computer-assisted theorem proving system and using the computer-assisted theorem proving system to analyze the mathematical induction proofs to determine if the MSP 601 is satisfied The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures may be represented by a numeral. For purposes of clarity, not every component may be labeled in every drawing. In the drawings:

FIGS. 10A-10D is code for device and DMA Modeling in the Temporal Logic of Actions PlusCal Specification Language, according to some embodiments;

FIG. 11A-11C is code for MMU Modeling in the Temporal Logic of Actions PlusCal Specification Language, according to some embodiments;

FIGS. 12A-12D is code for a Processor/Thread Modeling in the Temporal Logic of Actions PlusCal Specification Language, according to some embodiments;

FIGS. 13A-13C is code for an Interrupt Modeling in the Temporal Logic of Actions PlusCal Specification Language, according to some embodiments;

FIGS. 14A-14C is code for an Adversary Modeling in the Temporal Logic of Actions PlusCal Specification Language, according to some embodiments;

FIGS. 15A-15C is code for a Model Security Properties (MSP) defined in temporal logic within the Temporal Logic of Actions framework, according to some embodiments;

FIGS. 16A-16B: is code for Model Proof Tactics used to prove mathematical inductive proofs on Model Security Properties (MSP) invariants in the Temporal Logic of Actions Framework Proof-Manager (TLAPM), according to some embodiments.

DETAILED DESCRIPTION

Figure 1:
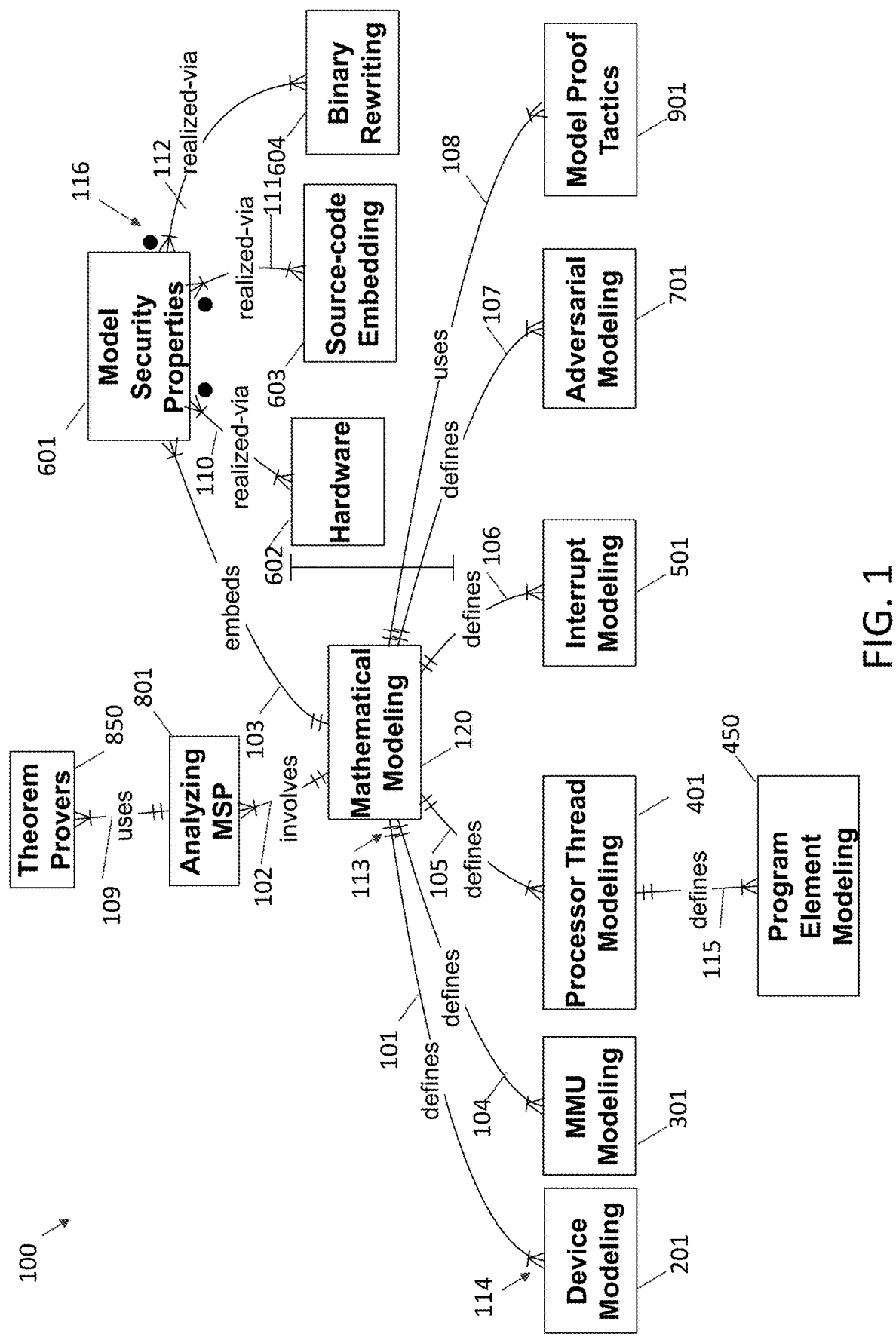
FIG. 1 is a system 100 for mathematical modeling of the hardware and software stack of commodity computer platforms to provide provable guarantees on memory, device and program execution.

The following nomenclature is used herein:

System agents: In the context of cybersecurity, system agents refer to software programs or entities that operate autonomously within a computer system or network to perform specific tasks, such as monitoring, analyzing, and responding to security-related events. Examples of system agents include intrusion detection systems, antivirus software, firewalls, and other security tools that interact with the system to prevent, detect, or mitigate cyber threats. These agents may be installed on individual devices, servers, or network nodes, and can communicate with each other and with external entities to share information and coordinate responses to security incidents.

Security solutions: In the context of cybersecurity, security solutions refer to products, services, or technologies designed to protect computer systems, networks, and data from unauthorized access, use, disclosure, disruption, modification, or destruction. These solutions may include hardware, software, firmware, or combinations thereof, and can provide various functions such as threat detection, prevention, incident response, encryption, authentication, authorization, and compliance management. Examples of security solutions include firewalls, intrusion detection systems, antivirus software, encryption tools, and identity and access management systems Runtime introspection: In the context of cybersecurity, runtime introspection refers to the ability of a system or software to examine and analyze its own internal state, behavior, and execution environment in real-time, while it is running. This self-examination enables the system to detect and respond to potential security threats, anomalies, or vulnerabilities that may arise during execution, such as memory corruption, unauthorized access, or malicious code injection. Runtime introspection can involve monitoring system calls, inspecting memory contents, analyzing network traffic, and other forms of self-observation to identify and mitigate security risks.

Monitoring framework: In the context of cybersecurity, a monitoring framework refers to a structured set of tools, protocols, and processes that enable continuous observation, analysis, and reporting of a system's or network's security-related data, such as logs, events, and performance metrics. The framework provides a systematic approach to collecting, processing, and visualizing security-relevant information, allowing for real-time threat detection, incident response, and security posture assessment Security property: In the context of cybersecurity, a security property refers to a specific attribute or characteristic of a system, network, or asset that is related to its security, such as confidentiality, integrity, availability, authenticity, or non-repudiation. Security properties define the desired security behavior or constraints of a system, and are often used to evaluate the effectiveness of security controls, protocols, or mechanisms in protecting against threats or vulnerabilities. A model security property is a security property codified in a mathematical model.

Invariant: In the context of mathematical modeling, an invariant refers to a property or quantity that remains unchanged or constant despite transformations, changes, or perturbations to the computer platform (an "immutable property"). Invariants are used to describe and analyze the behavior of complex systems, and can include quantities such as security, liveness, energy, time or symmetry, which remain preserved over time or under different conditions.

Security invariant: In the context of cybersecurity, a security invariant refers to a condition or property that must always hold true for a system, network, or asset to maintain its security, regardless of changes in state, inputs, or environmental conditions. Security invariants define the fundamental security constraints or assumptions that underlie a computer platform's design, and are used to ensure that the system remains secure even in the face of unexpected events or attacks.

Platform resource: In the context of cybersecurity, a platform resource refers to any component, service, or capability provided by a computer platform, such as an operating system, device, or cloud infrastructure, that can be utilized by applications, services, or users. Examples of platform resources include processing power, memory storage capacity/availability, network interfaces, input/output devices, and software libraries. In cybersecurity, platform resources are often the target of attacks or vulnerabilities, and securing them is essential to protecting the overall system.

Predicate: In the context of mathematical modeling, a predicate refers to a propositional or first-order logical statement that assigns a property or attribute to an object, system, or state. Predicates are used to express conditions, relations, or constraints that must hold true for a particular situation or set of circumstances, and are often used in formal specifications, models, and proofs to reason about the behavior and properties of systems.

Proof obligations: In the context of mathematical modeling, proof obligations refer to the set of conditions or properties that must be formally proven or verified to ensure the correctness, consistency, and validity of a mathematical model or specification. These obligations typically arise from the axioms, definitions, and inference rules used in the model, and are often discharged using formal proof techniques, such as deductive reasoning, model checking, or theorem proving Theorem prover: In the context of mathematical modeling, a theorem prover refers to a software tool or system that assists in the formal proof and verification of mathematical statements or theorems. Theorem provers use logical and mathematical rules to check the validity of a proof, ensuring that it is correct and rigorous, and providing a high degree of confidence in the results. They are often used to verify the correctness of mathematical models, specifications, and algorithms, and to establish the soundness and completeness of formal systems. Theorem provers can be completely automated (i.e., require no user intervention) or interactive (i.e., require some amount of user intervention)

Operational state space: In the context of mathematical modeling, an operational state space refers to the set of all possible states that a computer platform can occupy during its operation, including its current conditions, configurations, and modes. The operational state space specifies the boundaries and constraints within which the computer platform, and is used to analyze, simulate, and predict the behavior of the system over time.

Cybersecurity regulation: A set of laws, guidelines, standards, or best practices that govern the protection of computer systems, networks, and sensitive information from cyber threats. Cybersecurity regulations aim to ensure the confidentiality, integrity, and availability of digital assets, and typically outline requirements for security controls, incident response, data breach notification, and compliance reporting.

Assume-guarantee interface confined mathematical reasoning: A way of mathematically reasoning about a computer platform by: (a) defining what each hardware element and software stack element of the computer platform expects from other hardware elements and software stack elements (assumptions); (b) defining what each hardware element and software stack element of the computer platform promises to deliver (guarantees); and (c) ensuring these assumptions and guarantees are clearly defined at the interfaces between hardware elements and software stack elements of the computer platform.

Mathematical Logic Language: A formal system of symbols, rules, and syntax used to express mathematical statements, arguments, and proofs in a precise and unambiguous way. It typically involves the use of logical operators (e.g., AND, OR, NOT), quantifiers (e.g., FOR ALL, THERE EXISTS), and propositional and predicate logic to represent and manipulate mathematical concepts, such as sets, relations, functions, and statements.

Computer platforms play a critical role in the daily life of countless people and organizations. Computer platforms include high-end servers; commodity platforms such as personal computers, laptops, and smartphones; internet of things (IoT) devices; and any platform that utilizes digital electronics, or even combinations of these devices often communicating together through a component network (the network being a definable computer platform itself). The current state of the art in computer platforms is characterized by an increasing reliance on system agents to implement desired security solutions. These agents make use of artificial intelligence (AI) and machine learning (ML) including runtime introspection and monitoring frameworks to effect protections. This approach has been largely successful in detecting and responding to complex threats, but it relies heavily on the integrity of the underlying operating environment.

The inventors have recognized and appreciated that the implicit trust placed in the operating environment by these agents can be exploited by sophisticated attackers. In the face of complex attacks such as memory access exploits (e.g., temporal and spatial buffer overflows, arbitrary pointer access, NULL pointer dereferencing) and code and data integrity exploits (e.g., code overwriting, DMA attacks, Return-oriented programming attacks and return-to-libc), the agents themselves can be compromised. This is because these attacks often target vulnerabilities in the operating environment that are not addressed by the agents' monitoring or introspection capabilities.

The inventors have recognized and appreciated that current cybersecurity solutions have several significant disadvantages. First, they rely on a reactive approach to security, where threats are detected and responded to after they have occurred. This can be too late for many organizations, which may already be facing significant financial and reputational damage from cyberattacks. Second, the use of system agents can introduce additional complexity and overhead into a computer platform, making the platform more difficult to manage and maintain. Finally, the implicit trust placed in the operating environment by these agents can create a false sense of security, leading organizations to underestimate their vulnerability to complex attacks.

The inventors have recognized and appreciated that the current approach to cybersecurity is insufficient to meet the needs of modern organizations. As the threat landscape continues to evolve and become increasingly sophisticated, new approaches are needed to provide mathematically backed security and availability guarantees that can eliminate entire classes of cyberattacks by design and hence provide a proactive designed-in approach to cybersecurity.

The inventors have recognized and appreciated that mathematical modeling of the design of a computer platform is needed to address the shortcomings of modern cybersecurity solutions. The design of the computer platform encompasses both the hardware elements and software stack elements of the computer platform and includes defining not only the structural relationship between these elements but also how the elements interact with each other and external devices (i.e., it encompasses the operation of the computer platform). Such modeling ensures through a process called "formal verification" that the computer platform, when built in accordance with the design, can provide guarantees that required properties are invariant throughout the operational lifetime of the computer platform. The operational lifetime or simply lifetime of a computer platform is the time period in which the computer platform will be expected to execute program execution elements. These required properties are referred to as the "invariants" or equivalently as the "immutable properties" that are to be designed into the computer platform. The guarantee that these invariants are truly invariant can be proven through mathematical modeling, performed at the design stage of the computer platform, of the hardware elements and software stack elements at the very lowest operating level such as at the memory, peripheral, processor, and program execution element levels. If the model determines that the invariance of the invariants cannot be guaranteed the design of the computer platform is proven to be faulty and modifications to the computer platform design will be required to achieve guaranteed invariants. By creating and evaluating this mathematical model the design of a computer platform can be validated for the desired invariants. If the design fails validation, the mathematical model can direct the designers of the computer platform exactly how it failed so that the iterative design improvements can be made until validation is successful. Thus, the mathematical model can be used, for example, to improve the design of a computer platform or to evaluate if an existing computer platform meets the invariance (e.g., security) requirements of a target application.

A computer platform for which the mathematical modeling method is to be applied has hardware elements and software stack elements.

Hardware elements may include memory, processors, peripherals, and other hardware components of a computer platform.

Memory may include any type of volatile or non-volatile memory that may be part of the computer platform.

Processors includes processing devices such as for example and not limitation, central processing units (CPUs) including single and multi-core designs, digital signal processor (DSPs), controllers, general or special purpose microprocessors, microcontrollers, field programmable gate arrays (FPGAs), application specific integrated circuits (ASICs), or any suitable processing device. In some embodiments, the computer platform may have one or more processors of the same or different types.

Peripherals provide the input and output hardware that the computer platform uses to interface outside itself. These could include sensors, network interfaces, user interface devices, and any other suitable component for interfacing outside the computer platform itself.

Software stack elements provide instructions that can be operated on by the processor(s) of the computer platform. Instructions may be in the form of computer code. Such processor executable instructions may be referred to as program execution elements. Program execution elements may be composed of functions and instructions within functions as atomic execution units, which access platform memory and peripherals through prescribed interfaces. Examples of software stack elements include, but are not limited to, bios, operating systems (OS), hypervisors, trusted execution environment, libraries application, and other suitable software. In some embodiments, program execution elements may be run on the same processor or be spread across different processors.

In some embodiments, the purpose of the mathematical modeling method is to validate that a computer platform will maintain specified properties throughout the lifetime of the computer platform. Validation guarantees each of the specified properties is invariant for the lifetime of the computer platform.

In some embodiments, the mathematical modeling method includes (1) specifying interfaces to platform memory, peripherals, processors, and program execution elements of the computer platform; (2) specifying operational aspects of the hardware elements and software stack elements of the computer platform; and (3) specifying invariants to be proven (and thus guaranteed) hold throughout the lifetime of the computer platform.

An interface is a description of the interfaces of hardware elements and software stack elements. In the case of hardware elements, the description of the interface may detail how information is communicated to and from the hardware. In the case of software stack elements, the description of the interface may be, for example, an application programming interface API). These interfaces can be used for loading data, storing data, executing other functions and instructions of program execution elements, and accessing platform memory and peripherals.

Operational aspects are the fundamental capabilities for each of the hardware elements and the software stack elements. The operational aspects of a memory may include, for example, read, write, and execute. The operational aspects of a processor may include executing instructions and manipulating hardware registers, The operational aspects of a peripheral may include input from a keyboard, mouse, camera etc. and output to a printer, disk or other forms of storage media. The operational aspects of a program execution element may include reading file, writing to a file and read/write from/to a peripheral.

The invariants to be proven are initially the required properties of the computer platform. In some embodiments, the invariants used to specify guarantees can be security invariants that describe a security property such as control for integrity, memory safety, memory-integrity, control-flow integrity, privilege separation, or approved execution. Invariants may additionally or alternatively be liveness properties that describe availability of a particular platform resource.

Collectively, the definition of the interface, the operational aspects, and the invariants provide a mathematical model. The mathematical model may be expressed in a mathematical logic 302 language that enables precise modeling of the computer platform including program execution down to the granularity of function calls and instructions within functions. In some embodiments, the mathematical model is expressed, for example, in Temporal Logic of Actions (TLA+).

The mathematical modeling method may comprise analyzing the mathematical model to determine if the invariants hold throughout the lifetime of the computer platform.

In some embodiments, the analysis determines if a particular state (in terms of function and/or instruction) in an operational state space for the computer platform can be reached from an initial state for all possible state transitions of the mathematical model. If such a counterexample is generated, it can show that a specific operational aspect of the computer platform is not in compliance with an applicable cybersecurity regulation.

In some embodiments, analyzing the invariants comprises determining whether a model system property (MSP 601) for either the security or availability property of the computer platform is satisfied. This analysis can be performed using theorem provers 850 that translate predicates into proof obligations.

In some embodiment, the MSP 601 relates to compliance with a cybersecurity regulation applicable to the computer platform. The mathematical modeling method can encode these invariants into a theorem prover and use it to analyze them to determine if the MSP 601 is satisfied. In some embodiments, analyzing the mathematical invariants can generate a counterexample that shows that the MSP 601 does not hold for an operational aspect of the computer platform.

In some embodiments, analyzing the mathematical invariants comprises determining whether a MSP 601 for a computer platform is satisfied and, upon a determination that it is not satisfied, generating a counterexample that shows that the MSP 601 does not hold for the computer platform program execution. This analysis can be performed using theorem provers 850.

In some embodiments the mathematical model of a computer platform specifies operational aspects of the computer platform's hardware elements and software stack elements via program execution elements running on one or more computing processors of the platform.

The mathematical method provides that analyzing the invariants comprises determining whether an MSP 601 for a commodity computer platform is satisfied, for example, using one or more theorem provers 850. Upon a determination that it is not satisfied, generating a counterexample that shows that the MSP 601 does not hold for at least one program execution element.

The Linux and Windows operating systems are examples for program execution elements with libraries, applications, kernel, and kernel-modules. In some embodiments, the mathematical logic 302 language used is Temporal Logic of Actions (TLA+) combined with Hoare logic. Though, any suitable mathematical logic 302 language or combination of mathematical logic 302 languages may be used. The system may include theorem provers 850, such as Z3, CVC4, or Alt-ergo, to analyze the mathematical invariants and determine if the MSP 601 is satisfied. In some embodiments, an interactive theorem prover such as Coq can be used for verification. Program execution element instructions access platform memory and peripherals through prescribed interfaces. The system analyzes the mathematical invariants to determine whether an MSP 601 for either the security or availability property of the computer platform is satisfied.

The advantages of some embodiments of the method over traditional methods of verifying program execution elements may include precise modeling, interface analysis and guarantee verification. The method may allow for precise modeling of complex systems, such as operating systems, using high-level abstractions. Regarding interface analysis, the method may provide a precise description of the interactions between components, allowing for the analysis of potential security vulnerabilities or availability bottlenecks. The method may also allow for the verification of guarantees via invariants with assume-guarantee interface-confined mathematical reasoning that hold throughout the lifetime of the computer platform execution and can be composed across one or more computer platform executions.

Some embodiments provide a robust framework for ensuring the security and reliability of computer platforms by providing provable guarantees on memory, computing processors, peripheral, and program execution. Further, the embodiments may provide a powerful tool for verifying program execution elements and ensuring compliance with cybersecurity regulations applicable to commodity computer platforms.

FIGS. 1-4, 6, 7 and 9 show diagrams for some embodiments of the systems and methods described herein. For purposes of discussion each of the diagrams is referred to as a system, however, it should be appreciated that discussed systems may also be implemented through corresponding methods. Some embodiments of the disclosed diagrams (whether through systems or methods) may not include all of the blocks shown in the corresponding diagram, or may include other blocks/steps not represented in the diagrams.

Each of the diagrams include blocks (e.g., blocks 120 and 201 in FIG. 1) and connecting lines (e.g., connecting line 101 in FIG. 1). Each block may represent, for example, stored information (e.g., a definition for a peripheral), an aspect of a method (e.g., a method step), or a module of the corresponding system. A module comprises the hardware and/or software, to implement a defined capability (e.g., the corresponding method step). For example, such a capability may be implemented through a module having one or more processors executing computer code stored on one or more non-transitory computer-readable storage medium. In some embodiments, a capability is implemented at least in part through a module having dedicated hardware (e.g., an ASIC, an FPGA). In some embodiments modules may share components. For example, a first function module and a second function module may both utilize a common processor (e.g., through time-share or multithreading) or have computer executable code stored on a common computer storage medium (e.g., at different memory locations). In some instances, a module may be identified as a hardware module or a software module. A hardware module includes or shares the hardware for implementing the capability of the module. A hardware module may include software, that is, it may include a software module. A software module comprises information that may be stored, for example, on a non-transitory computer-readable storage medium. In some embodiments, the information may comprise instructions executable by one or more processors. In some embodiments, the information may be used at least in part to configure hardware such as an FPGA. The capability of a software module may be implemented, for example, by reading the software module from a storage medium and executing it with one or more processors, or by reading the software module from a storage medium and using the information to configure hardware.

The relationship between blocks is illustrated by connecting lines. The termination of a connecting line indicates whether there may be multiple instances of a block present in the illustrated embodiment. Specifically, the symbol 113 (FIG. 1) indicates that the connection is to a single functional block while the symbol 114 (FIG. 1) indicates that the connection may be to multiple functional blocks. For example, connecting line 101 connects a single mathematical modeling block 120 to one or more device modeling blocks 201. Unless explicitly stated otherwise, a connection with the symbol 113 (FIG. 1) is the starting point of the flow while the symbol 114 (FIG. 1) is the ending point of the flow for a given connecting line. For example, the flow of connecting line 101 is from the mathematical modeling 120 functional block to the device modeling 201 functional block. For some connecting lines, the starting point of the flow is indicated via a shaded circle symbol 116 (FIG. 1). For example, connecting line 110 connects model security properties 601 to hardware 602 and is read as one or more model security properties 601 are realized-via one or mode hardware 602.

Solid connecting lines such as connection line 101 (FIG. 1) represent flow, interaction and dependency between various functional blocks.

There are several types of connection lines. A "defines" connecting line (e.g., connecting line 101, FIG. 1) indicates that one functional block provides a definition or specification for another functional block. An "involves" connecting line (e.g., connecting line 102, FIG. 1) indicates that one functional block participates in, contributes to, or is a part of another functional block's process, activity, or functionality. An "embeds" (e.g., connecting line 103, FIG. 1) indicates that one functional block is contained within, integrated with, or incorporated into another functional block. A "uses" connecting line (e.g., connecting line 109, FIG. 1) indicates that one functional block utilizes, employs, or depends on another functional block to function or operate. A "realized-via" connecting line (e.g., connecting line 110, FIG. 1) indicates that one functional block is implemented, achieved, or made possible through the use of another functional block.

A "specifies" connecting line (e.g., connecting line 202, FIG. 2) indicates that one functional block provides detailed information, constraints, or requirements for another functional block. A "configures" connecting line (e.g., connecting line 204, FIG. 2) indicates that one functional block sets up, arranges, or customizes the properties, settings, or behavior of another functional block. A "protected-by" connecting line (e.g., connecting line 205, FIG. 2) indicates that one functional block is safeguarded, secured, or shielded from harm or unauthorized access by another functional block. A "models-state" connecting line (e.g., connecting line 211, FIG. 2) indicates that one functional block represents or captures the condition, status, or situation of another functional block at a particular point in time. A "models-execution" connecting line (e.g., connecting line 209, FIG. 2) indicates that one functional block simulates, emulates, or represents the behavior, workflow, or processing of another functional block over time. A "peer-to-peer-access" connecting line (e.g., connecting line 214, FIG. 2) indicates that two or more functional blocks communicate, exchange information, or interact with each other directly, without a centralized authority or intermediary. A "accesses" connecting line (e.g., connecting line 207, FIG. 2) indicates that one functional block retrieves, reads, writes, or otherwise interacts with the data, resources, or functionality of another functional block.

A "reads-from" connecting line (e.g., connecting line 316, FIG. 3) indicates that one functional block retrieves or accesses data, information, or content from another functional block. A "write-to" connecting line (e.g., connecting line 317, FIG. 3) indicates that one functional block creates, updates, or modifies data, information, or content in another functional block. A "executes-from" connecting line (e.g., connecting line 318, FIG. 3) indicates that one functional block runs, invokes, or triggers the execution of a process, function, or code stored in another functional block. A "caches" connecting line (e.g., connecting line 320, FIG. 3) indicates that one functional block stores a copy of data, information, or content from another functional block to improve performance, reduce latency, or enhance availability. A "controls" connecting line (e.g., connecting line 319, FIG. 3) indicates that one functional block regulates, manages, or directs the behavior, actions, or decisions of another functional block. A "belongs-to" connecting line (e.g., connecting line 322, FIG. 3) indicates that one functional block is a part of, associated with, or owned by another functional block. A "resides-in" connecting line (e.g., connecting line 324, FIG. 3) indicates that one functional block is located within, hosted by, or contained within the boundaries of another functional block, such as a physical location, network, or system.

A "bootstraps" connecting line (e.g., connecting line 407, FIG. 4) indicates that one functional block initializes, starts, or sets up another functional block. A "contains" connecting line (e.g., connecting line 409, FIG. 4) indicates that one functional block encompasses, encloses, or holds another functional block. A "executes" connecting line (e.g., connecting line 410, FIG. 4) indicates that one functional block runs, performs, or carries out the instructions, actions, or functionality of another functional block. A "consists-of" connecting line (e.g., connecting line 413, FIG. 4) indicates that one functional block is composed of, made up of, or comprises multiple other functional blocks. A "issues" connecting line (e.g., connecting line 427, FIG. 4) indicates that one functional block generates, produces, or emits something (e.g., a command, signal, or message) that affects or is received by another functional block. A "operates-on" connecting line (e.g., connecting line 429, FIG. 4) indicates that one functional block performs an action, function, or transformation on another functional block. A "mapped-to" connecting line (e.g., connecting line 433, FIG. 4) indicates that one functional block is associated with, correlated to, or transformed into another functional block. A "controlled-by" connecting line (e.g., connecting line 436, FIG. 4) indicates that one functional block is regulated, directed, or influenced by another functional block.

A "notifies-interrupt" connecting line (e.g. connecting line 563, FIG. 5) indicates that one functional block (e.g., a hardware device or software component) sends an interrupt signal to another functional block (e.g., the CPU), notifying it of an event or condition that requires immediate attention. "prioritized-by" connecting line (e.g., connecting line 574, FIG. 5) indicates that one functional block (e.g., a scheduler or priority manager) determines the order or priority in which another functional block (e.g., a task, process, or thread) is executed or allocated resources. A "consults" connecting line (e.g., connecting line 570, FIG. 5) indicates that one functional block (e.g., a program or service) requests advice, guidance, or information from another functional block (e.g., a configuration file, database, or expert system), which provides input to inform the decision-making process.

A "affects" connecting line (e.g., connecting line 723, FIG. 7) indicates that one functional block (e.g., an adversary's action or exploit) has a direct impact on another functional block (e.g., memory or processor), potentially compromising its security, integrity, or functionality.

A "employ" connecting line (e.g., connecting line 906, FIG. 9) indicates that one functional block utilizes or leverages another functional block to achieve a specific security goal or property. A "proven-by" connecting line (e.g., connecting line 907, FIG. 9) indicates that one functional block demonstrates or establishes the validity or correctness of another functional block, providing a rigorous guarantee of its properties. A "satisfy" connecting line (e.g., connecting line 908, FIG. 9) indicates that one functional block meets or fulfills the requirements or constraints of another functional block, ensuring that certain properties are maintained. A "generates" connecting line (e.g., connecting line 905, FIG. 9) indicates that one functional block produces or creates another functional block.

FIG. 1 shows a diagram of a system 100 for formal verification of a computer platform. System 100 provides a mathematical model of the hardware and software stack elements of the computer platform. System 100 formally verifies guarantees on memory, computing processors, peripherals, and program execution. In some embodiments, if the guarantees cannot be formally verified, system 100 provides a counterexample as output so that the computer platform can be redesigned to address the counterexample. The mathematical model of the computer platform can be updated to reflect the updated computer platform design and the system can again attempt to verify the computer platform. This process can be repeated until formal verification of all guarantees has been successful.

Mathematical modeling block 120 defines (see connecting line 101) one or more device modeling blocks 201 (e.g., multiple peripherals in a platform). Mathematical modeling block 120 also defines (see connecting line 104) one or more memory management unit (MMU) modeling blocks 301 (e.g., multiple memory in a platform). Mathematical modeling block 120 also defines (see connecting line 105) one or more processor thread modeling blocks 401 (e.g., multiple processors) which each in turn defines (see connecting line 115) one or more program element modeling blocks 450 (e.g., multiple program elements per processor). Mathematical modeling block 120 defines (see connecting line 1106) one or more interrupt modeling blocks 501 (e.g., multiple sources of interrupts in a computer platform). Mathematical modeling block 120 defines (see connecting line 107) one or more adversarial modeling blocks 701 (e.g., multiple adversaries). Mathematical modeling block 120 uses (see connecting line 108) one or more model proof tactics blocks 901 for modeling purposes. Mathematical modeling block 120 embeds (see connecting line 103) one or more MSP 601 in the mathematical model. One or more MSP 601 can be realized via (see connecting line 110) one or more hardware capabilities (represented by hardware block 602), realized via (see connecting line 111) one or more source code embedding techniques (represented by source-code embedding block 603), or realized via (see connecting line 112) one or more binary rewriting techniques (represented by binary rewriting block 604). Finally, mathematical modeling block 120 involves realized via (see connecting line 102) analyzing one or more MSP 601 (represented by analyzing MSP 601 block 801) by using (see connecting line 109), for each MSP 601 to be analyzed, one or more theorem provers 850 for proving the model security property invariant.

Device modeling block 201 represents a mathematical model that involves specifying a computer platform's behavior through a mathematical model that defines devices accessing platform memory via a DMA interface and governs access control permissions using DMA access control tables and/or channels. Device modeling block 201 is discussed further below in connection below with subsystem 200 shown in FIG. 2.

MMU modeling block 301 is a region-based memory modeling approach that may use Hoare logic and separation logic to support multiple words and pointers, allowing for accurate mapping into underlying commodity computer platform processor architectures. The model specification also includes access control matrices 314 implemented in hardware, software, or a combination of both, enabling fine-grained control over memory regions 321 at given address spaces 323 and privilege levels 325. MMU modeling block 301 is discussed further below in connection below with subsystem 300 shown in FIG. 3.

Processor thread modeling block 401 and program element modeling block 450 may provide a method that employs processor modeling using mathematical process calculi 270 logic to accurately capture the behavior of commodity computer platforms, including concurrent instruction execution and program element 412 invocation across memory address spaces. Processor thread modeling block 401 and program element modeling block 450 are discussed further below in connection with subsystem 400 shown in FIG. 4.

Interrupt modeling block 501 may provide a method of providing a mathematical model for analyzing and predicting the behavior of interrupt operations on commodity computer platforms, which enables the identification of potential vulnerabilities to attacks. By using non-deterministic finite automata (NFA) modeling and process calculi to simulate various scenarios, including regular and virtualized environments, the proposed method can predict how interrupts are generated, prioritized, signaled, and processed on different CPU architectures. Interrupt modeling block 501 is discussed further below in connection with method 500 shown in FIG. 5 and subsystem 550 shown in FIG. 6.

Adversarial Modeling block 701 may provide a method for specifying a mathematical model that captures the behavior of a computer platform in the presence of adversarial actions, including program execution functions, Direct Memory Access (DMA), and interrupts, using mathematical process calculi 270 and mathematical non-determinism 260. Adversarial Modeling block 701 is discussed further below in connection below with subsystem 700 shown in FIG. 7.

Analyzing MSP block 801 may provide a method to determine whether an MSP 601 for security or availability is satisfied, even in the presence of an active adversary, using a computer-assisted theorem proving system. Analyzing MSP block 801 is discussed further below in connection below with method 800 shown in FIG. 8.

MSP block 601 may provide a method to realize MSP 601 in program element 412 implementation that involves leveraging commodity CPU hardware 602 security capabilities, modifying source code 603 using compilers, or directly modifying binary instruction sets using binary rewriting 604 tools and disassemblers, allowing programmers to create highly secure and reliable systems with provable guarantees on system operation.

Model proof tactics 901 may provide a method of modeling and proof tactics (MTs) for generating mathematical inductive proofs 902 related to MSP 601. Model proof tactics 901 is discussed further below in connection below with subsystem 900 shown in FIG. 9.

Device Modeling Block 201

The concept of devices and device DMA has been a cornerstone of computer architecture for decades, allowing for efficient data transfer between peripheral devices and system memory without involving the Central Processing Unit (CPU). However, this very efficiency can also be exploited by attackers to gain unauthorized access to sensitive program execution and/or data. In commodity computer platforms, DMA is typically facilitated through specialized DMA controllers or via peripheral bus messages such as the Peripheral Component Interconnect (PCI) bus or Advanced eXtensible Interface (AXI) bus.

To mitigate these risks, device modeling block 201 of system 100 may implement a mathematical modeling method involving specifying a computer platform's behavior through a mathematical model that defines devices accessing platform memory via a DMA interface. This is illustrated by subsystem 200 shown in FIG. 2, which includes device modeling block 201. Subsystem 200 may be a subsystem to system 100. Subsystem 200 provides models of certain components of a computer platform such as the computer platform's peripheral devices (see devices 250), memory (see memory 240), and DMA controller (see DMA controller 210). For simplicity the connection of device modeling block 201 to mathematical modeling block 120 of system 100 is not shown in FIG. 2.

Device modeling block 201 specifies (see connecting line 202) more or more DMA controller blocks 210. Device modeling block 201 specifies (see connecting line 208) one or more devices 250. Device modeling block 201 uses (see connecting line 213) one or more mathematical process calculi block 270. Device modeling block 201 uses (see connecting line 212) one or more mathematical non-determinism blocks 260. DMA controller 210 defines (see connecting line 203) one or more DMA control tables 220. DMA control table 220 configures (see connecting line 204) one or more access control channels 230. Access control channel 230 controls (see connecting line 206) one or more devices 250. Access control channel 230 is protected by (see connecting line 205) one or more memories 240. Devices 250 access (see connecting line 207) one or more memories 240. In some embodiments, some or all of devices 250 may be capable of peer-to-peer communication (see connecting line 214). Mathematical process calculi block 270 models the execution (see connecting line 209) of the one or more devices 250. mathematical non-determinism block 260 models the state (see connecting line 211) of the one or more devices 250.

The DMA access control table 220 and/or access control channels 230 govern the access control permissions of devices 250 to access specified regions of memory 240. Tables 220 and channels 230 may be implemented in the computing platform hardware and programmable via software source or binary embedding within the program element.

Figure 2:
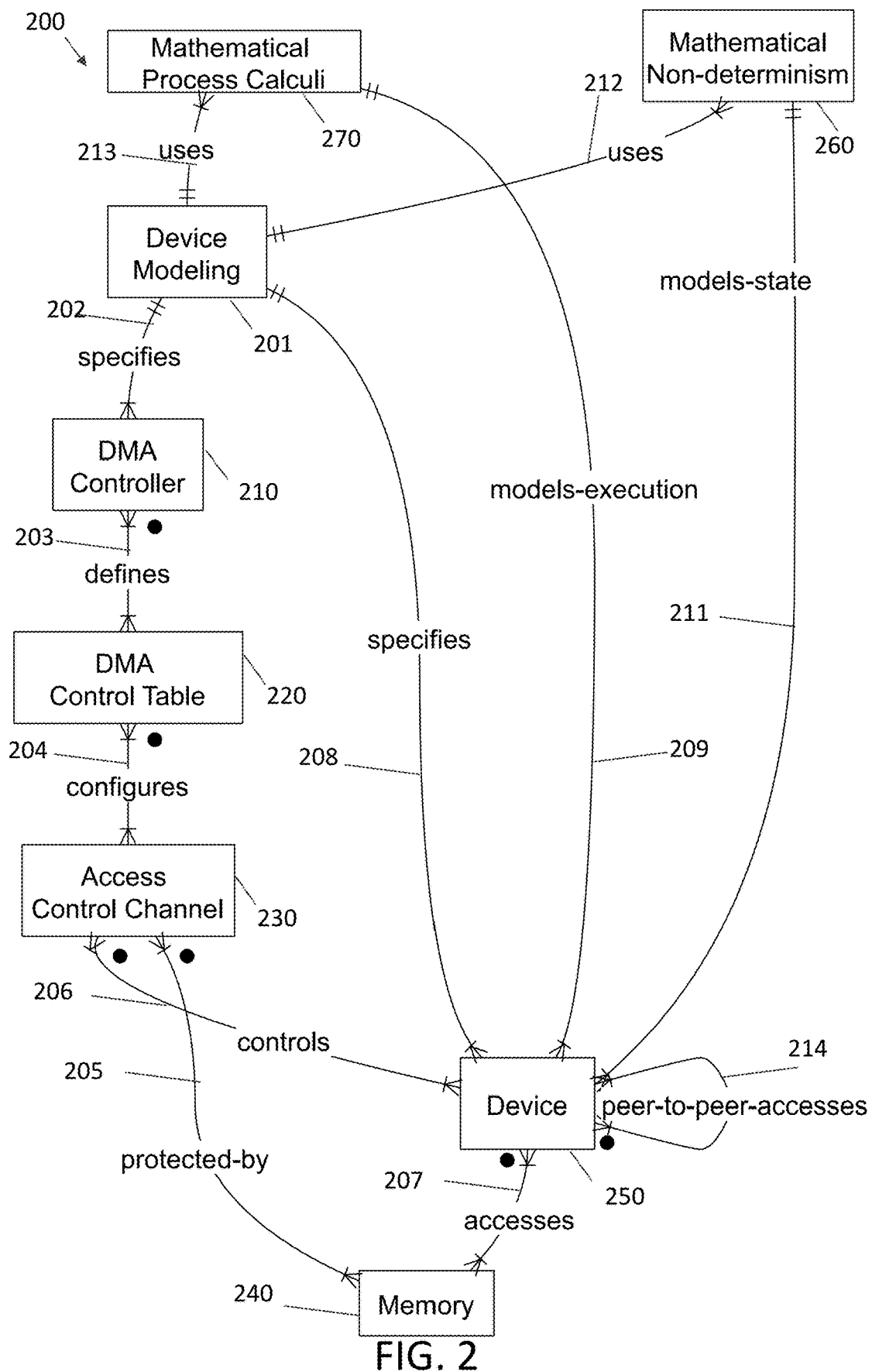
FIG. 2 is a system 200 for device modeling specifying devices accessing platform memory via a direct memory access interface and governs access control permissions using direct memory access (DMA)

The embodiment of subsystem 200 illustrated in FIG. 2 leverages existing mechanisms on modern computer platforms, such as IO Memory Management Units (IOMMU) or device exclusion vectors, which serve as access control matrices to permit or prevent DMA access from devices 250. In computer platforms without an IOMMU, DMA controllers 210 act as mediators for DMA operations and provide access control channels 230 and their configuration necessary for performing DMA transfers.

The subsystem 200 defines devices accessing platform memory via a DMA interface defined for DMA controller 210, with DMA access control table 220 and/or access control channels 230 governing access control permissions. This mathematical process calculi 270 logic allows for multiple devices to access DMA concurrently in the computer platform. Furthermore, devices 250 specified as part of subsystem 200 can be computer platforms themselves, each of which can be modeled by a corresponding instantiation of system 100, and these "sub" computer platforms then become a device to the primary platform. The division of a computer platform into sub-computer platforms each of which is validated by an instantiation of system 100 can be done in as many tiers as may be required or desirable.

This modeling approach has significant implications for ensuring the security and integrity of program execution and data on computer platforms in the presence of platform devices 250 that could be malicious. The use of mathematical process calculi logic 270 enables the specification of complex scenarios involving multiple devices and DMA operations, making this approach particularly well-suited for modern computer platforms.

Subsystem 200 may be implemented using mathematical process calculi 270, such as pi-calculus or CCS. Such implementations include the interactions of devices 250 with memory 240 and other devices 250. This enables the specification of complex scenarios involving multiple devices and DMA operations, allowing for the analysis and verification of MSP 601 such as data integrity and confidentiality.

Mathematical non-determinism block 260 is used to model the finite-state behaviors of devices 250, including their responses to specific events or stimuli. This provides a powerful tool for analyzing and verifying device-level security policies.

Some embodiments include a DMA controller 210 that is modeled as a process that receives memory addresses from devices and transfers data between them using pi-calculus. Mathematical non-determinism block 260 is used to verify that DMA controller 210 behaves correctly under different input scenarios. In some embodiments, DMA controller 210 is a set of processes that interact with each other to transfer data between devices 250 and memory 240. The process calculus is used to model the behavior of these processes, including their interactions with memory 240 and other peripheral devices 250. Mathematical non-determinism block 260 is used to verify that DMA controller 210 behaves correctly under different input scenarios. This involves analyzing the finite-state behaviors of DMA controller 210 and verifying that it responds correctly to specific events or stimuli.

FIGS. 10A-10D shows snippets 1001 (FIG. 10A), 1002 (FIG. 10B), 1003 (FIG. 10C), and 1004 (FIG. 10D) of computer code in the PlusCal language that may be used in subsystem 200 for device 250 and DMA controller 210 to model the devices and DMA of the computer platform. Snippets 1001-1004 use the temporal logic of actions mathematical logic 302 and the high-level specification in the PlusCal language.

Snippet 1001 defines a procedure named dma_op that represents the operation of a DMA operation. It determines whether the DMA operation is allowed or not. The procedure utilizes a data structure called dma_tlb to represent the DMA access control information to store information about read and write sets for different TLM (Transaction Level Memory) or otherwise known as memory-mapped Input-Output for various devices.

Some embodiments of subsystem 200 involve leveraging existing hardware and software mechanisms on computer platforms to enforce access control permissions for DMA accesses. This includes using IOMMU or device exclusion vectors as DMA control table 220 and employing DMA controller 210 as mediators for DMA operations in systems without an IOMMU. By integrating these mechanisms into the mathematical model, the approach ensures that all DMA accesses are governed by a well-defined set of rules and permissions, providing a high degree of security and predictability across multiple commodity computer platform architectures such as x86, ARM, and RISC-V architectures.

In some embodiments, software source or binary embedding are used within the program element 412 to programmatically configure the DMA access control table and/or channels. This enables dynamic reconfiguration of the DMA access control channel 230 policies in response to changing system conditions or user requirements, making it possible to adapt the approach to diverse computing scenarios.

MMU Modeling Block 301

Figure 3:
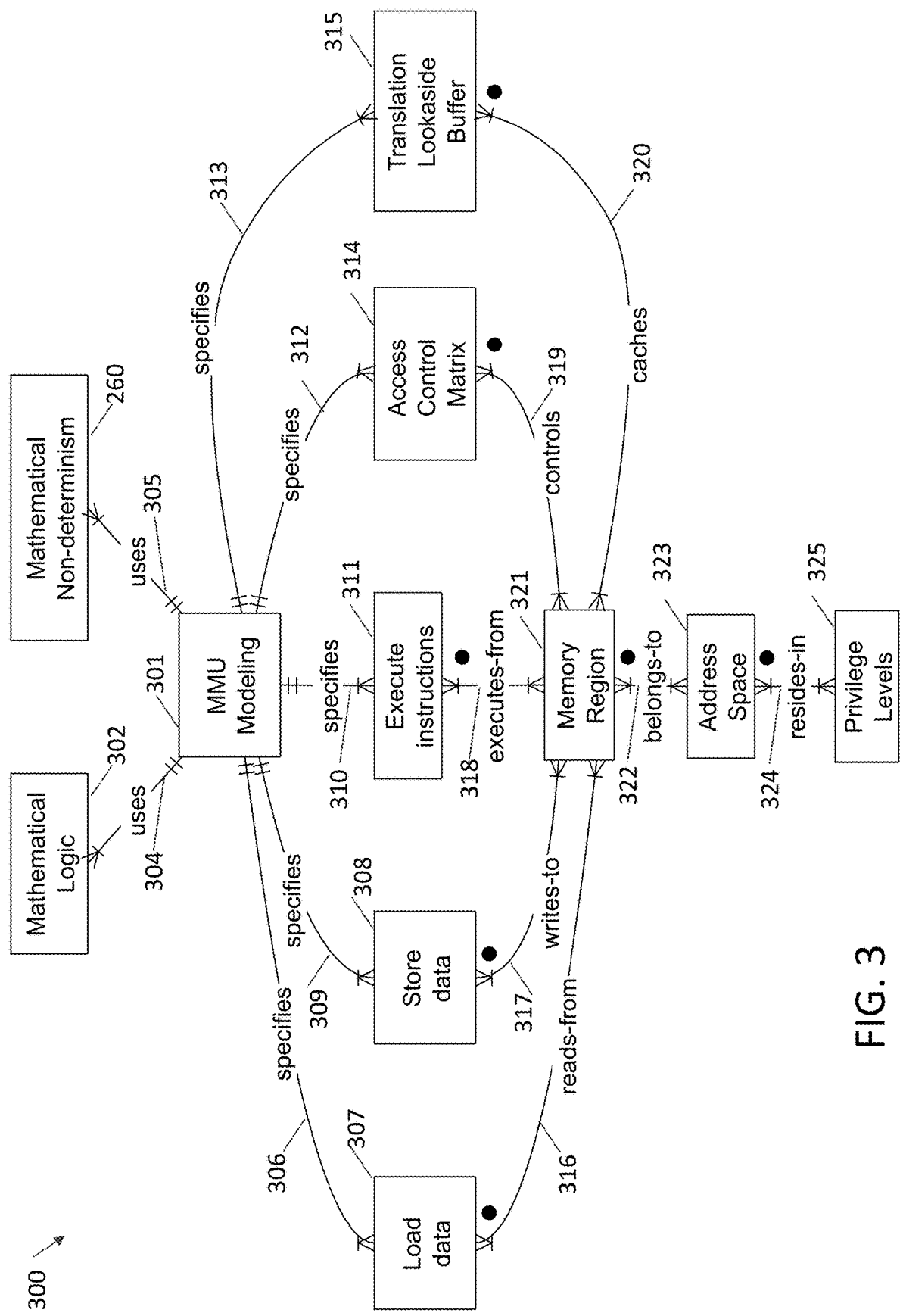
FIG. 3 is a system 300 for a region-based memory management unit (MMU) modeling method using mathematical logic 302 and mathematical non-determinism 260 enabling fine-grained modeling of memory at given address spaces and privilege levels.

The mathematical model of a computer platform models platform memory as being composed of one or more address spaces at one or more privilege levels. Specifically, the platform memory is divided into regions with defined access control, allowing for secure execution of programs. FIG. 3 shows a subsystem 300 illustrating an embodiment where the platform memory interfaces are specified to accommodate data load operations 307 and data store operations 308, as well as instruction execution 311 for code execution.

Subsystem 300 may be a subsystem to system 100; MMU modeling block 301 is shown in both systems. MMU modeling block 301 specifies (see connecting line 306) one or more load data operations 307. MMU modeling block 301 specifies (see connecting line 309) one or more store data operations 308. MMU modeling block 301 specifies (see connecting line 312) one or more access control matrices 314. MMU modeling block 301 specifies (see connecting line 313) one or more translation lookaside buffers 315. MMU modeling block 301 uses (see connecting line 302) one or more mathematical logic 302. MMU modeling block 301 uses (see connecting line 305) one or more mathematical non-determinism blocks 260. MMU modeling block 301 specifies (see connecting line 310) one or more execution instructions 311. Load data operations 307 reads from (See connecting line 316) one or more memory regions 321. Store data operations 307 writes to (See connecting line 317) one or more memory regions 321. Execution instructions 311 executes from (see connecting line 318) one or more memory regions 321. Access control matrix 314 controls (see connecting line 319) one or more memory regions 321. Translation lookaside buffers 315 caches (see connecting line 320) one or more memory regions 321. Memory regions 321 belongs to (see connecting line 322) one or more address spaces 323. Address spaces 323 reside in (see connecting line 324) one or more privilege levels 325.

The memory modeling approach employed by the present invention is region-based, using a combination of Hoare logic and separation logic to support multiple words and pointers. This allows for accurate mapping into underlying commodity computer platform processor architectures, such as total store order or weak memory models. The present invention further extends this memory model to include access control matrices 314, which can be implemented in computer platform hardware, software, or a combination of both.

The access control matrix 314 enables fine-grained control over memory regions at given address spaces and privilege levels. This feature is particularly useful for ensuring the secure execution of programs on commodity computer platforms. Furthermore, the present invention extends the memory model to include translation look-aside buffers 315 (TLBs), which allow for efficient caching of memory region addresses.

In addition to these core features, some embodiments also extend the memory model to use mathematical non-determinism 260 (such as NFA) to model TLB state. This approach is used to model one or more cache memories and/or regular system memories. This enables the efficient execution of programs that require frequent access to memory while still enabling verifying security invariants over their operational semantics. In some embodiment, the NFA incudes state transition modeling for the specific type of cache implementation such as write-back or write-through in conjunction with the memory load, store and execute operations.

FIGS. 11A-11C shows snippet 1101 (FIG. 11A), 1102 (FIG. 11B) and 1103 (FIG. 11C) for an embodiment of the MMU modeling block 301 using the temporal logic of actions mathematical logic 302 and the high-level specification in the PlusCal language. The provided specification defines procedures named mmu_load (see snippets 1101 and 1102) and mmu_execute (see snippet 1103) that model MMU load data 307 and MMU execute instructions 311, respectively. The procedure utilizes a data structure called mmu_tlb to represent the MMU access control matrix 314 to store information about read and write sets for different memory regions.

In some embodiments, the MMU modeling 301 models one or more memory allocator program elements, such as heap allocators or stack allocators. The stack allocator assigns memory from a pre-allocated stack space, which grows upwards as functions are called and shrinks downwards as they return. It is typically used for short-lived variables that don't need to persist between function calls, such as local variables in loops or recursive algorithms. On the other hand, the heap allocator dynamically allocates memory from a large pool, allowing for efficient use of system resources but also introducing risks like memory leaks and fragmentation if not managed properly. The heap allocator is often used for larger data structures that need to persist across function calls, such as dynamic arrays or linked lists in database operations or caching mechanisms.

The MMU modeling approach may be used, for example, on computer platforms with complex privilege levels and address spaces, such as x86, ARM, and RISC-V architectures. On these platforms, privilege levels can range from ring-0 through ring-3 (x86), host mode and guest mode (hardware virtualized x86), secure world and non-secure world (ARM), or user and supervisor privilege levels (RISC-V). Some embodiments provide a robust mathematical model that accurately captures the complexities of these platform architectures, enabling provable guarantees on memory accesses.

Several embodiments of the MMU modeling of the present invention are described below where the mathematical model can be used to ensure memory accesses adhere to the specified access control policies.

In some embodiments, the MMU's mathematical model defines multiple address spaces at various privilege levels, wherein each address space is associated with a unique set of access permissions and controls. The MMU's model may comprise a hierarchy of address spaces, including user-mode and kernel-mode addresses, as well as supervisory and privileged modes. Each address space is further divided into regions, which are protected by access control matrices that govern read, write, and execute permissions.

The MMU's mathematical model defines a set of memory interfaces for data transfer operations, including load and store instructions. The model defines a set of registers and buses that facilitate data transfer between the CPU and memory. The load instruction interface comprises a load address register (LAR) and a load value register (LVR), which are used to fetch data from memory and store it in a destination register. Similarly, the store instruction interface comprises a store address register (SAR) and a store value register (SVR), which are used to write data to memory from a source register.

The MMU's mathematical model defines an instruction fetch interface, which is responsible for retrieving instructions from memory and executing them on the CPU. The model defines a set of registers and buses that facilitate instruction fetching, including a program counter (PC) register and an instruction register (IR). The instruction fetch interface also comprises a decode unit, which decodes the fetched instructions and dispatches them to the execution units for processing The MMU's mathematical model defines a region-based mapping scheme. The model defines regions as contiguous blocks of memory that are protected by access control matrices. Each region is associated with a unique set of permissions, including read, write, and execute privileges.

The MMU's mathematical model defines a mapping scheme that takes into account the specific characteristics of various commodity computer platforms, including the total store order and weak memory models. The model defines a set of registers, buses and TLB that facilitate data transfer between the CPU and memory, while adhering to the specified memory ordering rules for each platform.

The MMU's mathematical model defines an access control matrix 314 that provides fine-grained control over memory regions 321. The access control matrix 314 is implemented in computer platform hardware, software, or a combination of both, depending on the specific requirements of each platform. The model defines a set of registers and buses that facilitate data transfer between the processor and memory, while adhering to the specified access control policies for each region.

The MMU's mathematical model defines a TLB that houses various types of caches, including instruction and data caches. Each cache has its own state machine that is modeled using mathematical non-determinism 260 such as write-through and write-back caching.

Processor Thread Modeling Block 401 and Program Element Modeling Block 450

The mathematical model employs processor modeling which can include various features such as operating on one or more supported address spaces, boot-strapping processors to begin execution at a given address within an address space, executing instructions from memory via the memory execute interface within an address space, and executing instructions for load and store via the memory read and write interfaces in an address space. Additionally, the processor can be modeled using mathematical process calculi 270 logic, allowing for one or more processors to execute instructions concurrently.

Figure 4:
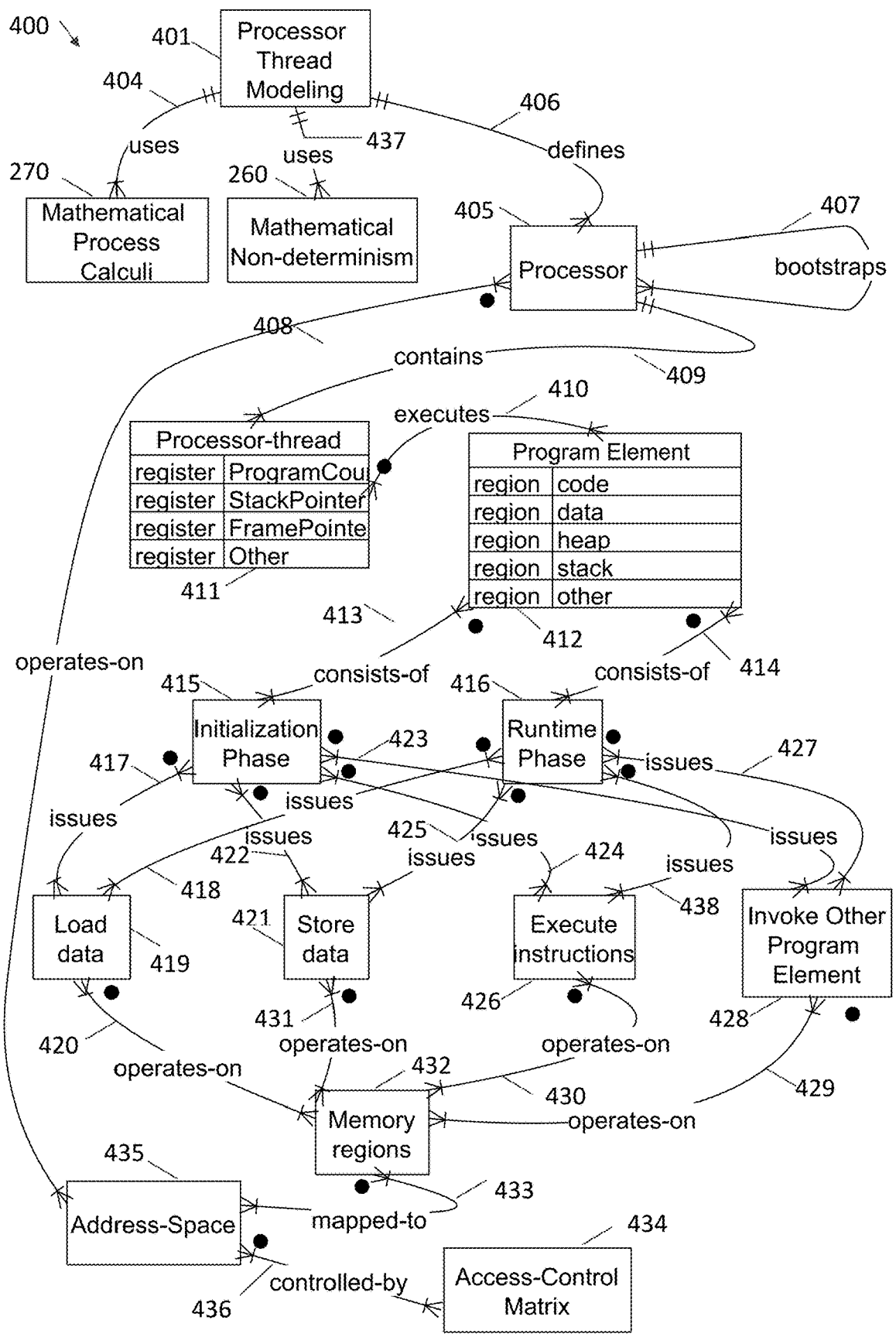
FIG. 4 is a system 400 of processor thread modeling using mathematical process calculi 270 and mathematical non-determinism 260 including concurrency and program element invocation across memory address spaces.

FIG. 4 shows the diagram of a subsystem 400. Subsystem 400 may be a subsystem to system 100; Processor thread modeling block 401 is shown in both systems. Processor thread modeling block 401 uses (see connecting line 404) one or more mathematical process calculi 270 402. Processor thread modeling block 401 uses (see connecting line 437) one or more mathematical non-determinism 260 blocks 403. Processor thread modeling block 401 defines (see connecting line 406) one or more processors 405. Each processor 405 may bootstrap (see connecting line 407) one or more of the other processors 405. Each processor 409 contains (see connecting line 409) one or more processor-threads 411 which each execute (see connecting line 410) on or more program elements 412. Program element 412 consist of (see connecting line 413) one or more initialization phases 415) and consist of (see connecting line 414) one or more runtime phases 416. Initialization phase 415 and runtime phase 416 each issue (see connecting lines 417 and 418) one or more load data operations 419, issue (see connecting lines 422 and 425) one or more store data operations 421, issue (see connecting lines 424 and 438) one or more execution instructions 426, and issue (see connecting lines 423 and 427) one or more invoke other program elements 428. Processors 405 also operate on (see connecting line 408) one or more address spaces 435. Address spaces 435 are controlled by (see connecting line 436) on or more access control matrices 434. Address spaces 435 are mapped to (see connecting line 433) one or more memory regions 432. Load data operations 419, store data operations 421, execution instructions 426, and invoke other program element 428 each operate on (see connecting lines 420, 431, 430, and 429) one or more memory regions 432.

The model of a processor executing instructions can also include program element execution on the commodity computer platform software stack. This can involve program elements spanning one or more memory address spaces, having one or more initialization phases and a runtime phase comprising one or more program elements, per memory address space, and tracking the location of the current program element via a per-processor program counter variable for a given memory address space. Invocation across program elements can be modeled using non-deterministic finite automata using the processor program counter.

The program element model consists of one or more memory regions that are mapped into a given memory address space. These memory regions encompass program element code, global data, heap, and stack in addition to other program element specific memory regions. The model maintains a stack for the program elements and a location of the stack via a per-processor stack pointer variable.

The program element model allows caller programming elements invoking other callee programming elements. This can involve the caller and callee being in the same address space, or the caller and callee being in different address spaces. The call between a caller and a callee program element is governed by one or more calling access control matrix which either allow or deny the call. The access control matrix can be implemented in hardware, via software source or binary embedding within the program element or a combination of the two.

The program element invocation modeling employs the program element stack and processor stack pointer to track call frames and nested invocation.

FIGS. 12A-12D show snippet 1201 (FIG. 12A), 1202 (FIG. 12B), 1203 (FIG. 12C) and 1204 (FIG. 12D) for the processor/thread modeling using the temporal logic of actions mathematical logic 302 and the high-level specification in the PlusCal language according to some embodiments. The provided specification uses the temporal logic "process" specification to use mathematical process calculi 270 to run multiple platforms and CPUs within platforms concurrently. Further, the program counter actions are performed using the temporal logic "either-or" specification which allows non-deterministic program counter actions to be modeled from initialization to runtime phases to various functions and calling mechanisms as shown in FIG. 12 for a trusted execution environment.

Some embodiments include a processor such as a x86, ARM, RISC-V processor, or another suitable architecture. The processor may include multiple virtual address spaces within privilege levels and physical address spaces mapped using specific memory mapping configurations and access control matrices.

In some embodiment, platform elements on the operating system (e.g., Linux, Windows) may comprise applications, shared libraries, kernel, and kernel-modules. Platform elements on firmware such as Unified Extensible Firmware Interface (UEFI) comprise the UEFI kernel and UEFI extension and expansion ROMs. Furthermore, platform elements on hypervisors comprise the hypervisor core and extensions.

The processor, thread, and program element modeling may accommodate all the aforementioned characteristics of a commodity computer platform. Some embodiments enable the definition and proof of security and availability invariants over operating states. This may be achieved by leveraging the virtual address spaces within privilege levels, physical address spaces mapped using specific memory mapping configurations and access control matrices, as well as the various platform elements on operating systems, firmware, and hypervisors.

Interrupt Modeling Block 501

Interrupt handling plays a crucial role in ensuring efficient and responsive system operation by allowing the processor to temporarily suspend its current task and handle an urgent event or request from another source, such as a hardware device or another process. This enables the system to multitask, prioritize tasks, and respond quickly to changing conditions. However, interrupt handling can also be exploited to deliver attack payloads leading to unauthorized code execution as well as violation of data integrity. Attackers may manipulate interrupts using, for example, buffer overflow attacks, kernel-mode attacks, or other forms of attack to bypass security measures, inject malicious code, or disrupt critical system functions.

The interrupt modeling block 501 concerns mathematical modeling of interrupt operation of commodity computer platforms.

Figure 5:
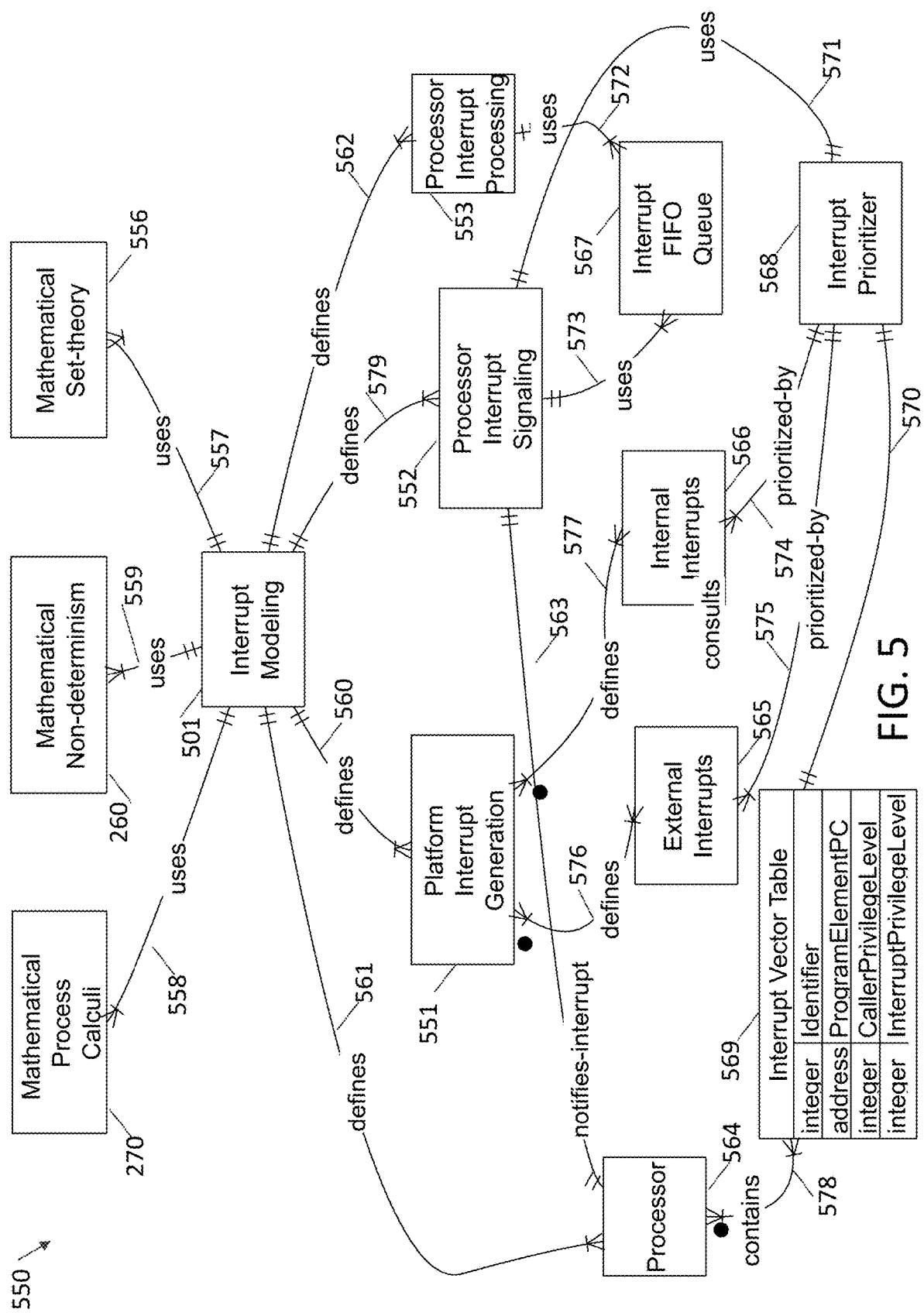
FIG. 5 is a system 550 for interrupt modeling using mathematical process calculi 270 and mathematical non-determinism 260 to support interrupt generation, signaling and processing.

FIG. 5 shows a diagram for subsystem 550. Subsystem 550 may be a part of system 100; interrupt modelling block 501 is shown in both system 100 and subsystem 550. Interrupt modelling block 501 uses (see connecting line 558) one or more mathematical process calculi 270. Interrupt modelling block 501 uses (see connecting line 598) one or more mathematical non-determinism blocks 260. Interrupt modelling block 501 uses (see connecting line 557) one or more mathematical set-theory blocks 556. Interrupt modelling block 501 defines (see connecting line 561) one or more processors 564. Interrupt modelling block 501 defines (see connecting line 560) one or more platform interrupt generation blocks 551. Interrupt modelling block 501 defines (see connecting line 579) one or more processor interrupt signaling blocks 552. Interrupt modelling block 501 defines (see connecting line 562) one or more processor interrupt processing blocks 553. Each processor interrupt signaling block 552 notifies/interrupts (see connecting line 563) processor 564 appropriately. Each processor 564 contains (see connecting line 578) one or more interrupt vector table data structures 569. Processor interrupt signaling block 552 uses (see connecting line 573) one or more interrupt FIFO (first in, first out) queues 567. Processor interrupt signaling block 552 uses (see connecting line 571) interrupt prioritizer 568. Processor interrupt processing block 553 uses (see connecting line 572) one or more interrupt FIFO queues 567. Interrupt prioritizer 568 consults (see connecting line 570) interrupt vector table data structure 569. Platform interrupt generation blocks 551 define (see connecting lines 576 and 577) one or more external interrupts 565 and one or more internal interrupts 566. external interrupts 565 and internal interrupts 566 are prioritized by (see connecting lines 575 and 574) interrupt prioritizer 568.

Subsystem 550 comprises one or more interrupt vector table data structures 569 per processor initialized to one or more program elements. This means that for each processor in the system, there is an associated interrupt vector table that contains information about which program elements are allowed to handle interrupts. The interrupt vector table can be modeled as a mathematical tuple consisting of identifier, caller program element privilege level, program counter, and interrupt privilege level (FIG. 5).

The interrupt modeling also comprises platform interrupt generation 551, where a set of processors is selected from the number of processors in the platform via mathematical non-deterministic finite automata modeling. This involves identifying which processors are responsible for generating interrupts. The set of interrupt vectors is then selected from a tuple of internal or external interrupts via mathematical non-deterministic finite automata. This means that the system determines which types of interrupts are generated and how they are prioritized.

The interrupt modeling further comprises processor interrupt signaling 552, where the selected processors are signaled for an interrupt with the corresponding interrupt vector and interrupt type (external or internal) via mathematical process calculi 270. This involves notifying the processors that an interrupt has been generated and providing them with information about which program elements can handle the interrupt. This is done via inserting the interrupt into an interrupt FIFO queue 567 for processing (FIG. 5). The proposed modeling approach includes support for multiple interrupt queues for priority based interrupt processing.

Figure 6:
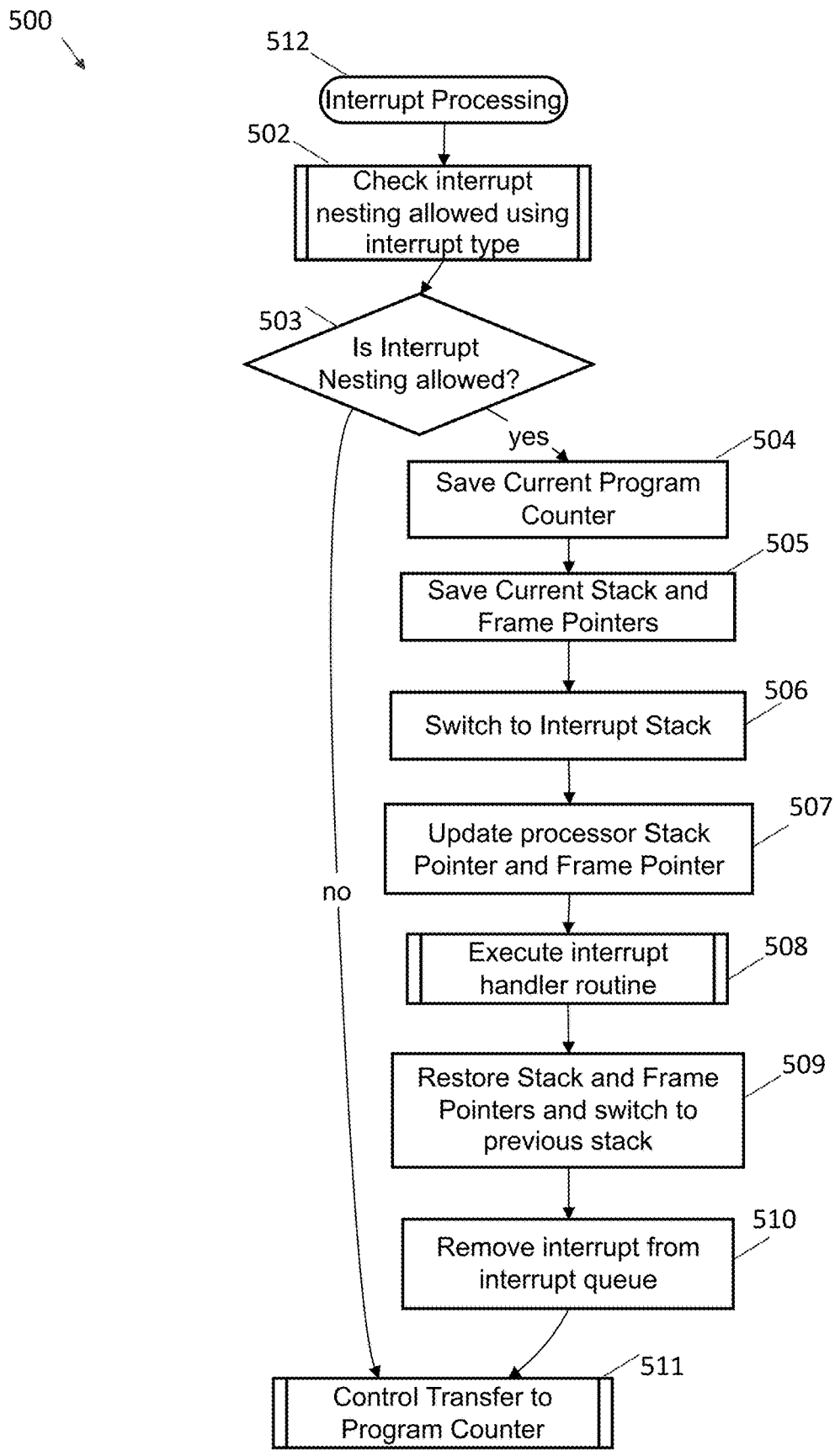
FIG. 6 is flow diagram of a method 500 for modeling of interrupt processing on a computer platform.

The interrupt modeling also comprises processor interrupt processing 553, where modeling interrupt processing comprises modeling internal interrupt processing and external interrupt processing as shown according to some embodiments, by method 500 in FIG. 6. External interrupts occur as a result of system device triggering interrupts whereas internal interrupts are due to processor related events such as exceptions and system calls. In both cases, the system saves the current processor program counter where the program element is being interrupted, switches program element stack to one or more interrupt stacks, updates the processor stack pointer variable, models the execution of the program element interrupt handling, switches back to one or more program element stack from the interrupt stack, and resumes control at the processor program counter the program element was interrupted at. Note that this modeling approach also supports nested interrupt handling in the event the processor supports it. In one embodiment of the present invention a lower-priority interrupt (internal interrupt) can be interrupted by a higher-priority interrupt (external interrupt).

At step 512, according to some embodiments of method 500, processing and interrupt begins.

At step 502, according to some embodiments of method 500, a check is made to ascertain whether interrupt nesting is allowed for the type of interrupt.

At step 503, according to some embodiments of method 500, it is determined if nesting is allowed. If nesting is allowed, method 500 proceeds to step 504. If nesting is not allowed, method 500 proceeds to step 511.

At step 504, according to some embodiments of method 500, the program counter is saved.

At step 505, according to some embodiments of method 500, the current stack and frame pointers are saved.

At step 506, according to some embodiments of method 500, the interrupt stack is switched to.

At step 507, according to some embodiments of method 500, the processor stack pointer and frame pointer are updated.

At step 508, according to some embodiments of method 500, an interrupt handler routine is executed.

At step 509, according to some embodiments of method 500, the stack and frame pointers are restored.

At step 510, according to some embodiments of method 500, the interrupt is removed from the interrupt queue.

At step 511, according to some embodiments of method 500, control is transferred to the program counter.

FIGS. 13A-13C show snippets 1301 (FIG. 13A), 1302 (FIG. 13B), 1303 (FIG. 13C) implementing the interrupt modeling using the temporal logic of actions mathematical logic 302 and the high-level specification in the PlusCal language. The provided specification uses the temporal logic "either-or" specification which allows non-deterministic actions to be performed for interrupt generation, signaling and processing. These encoded interrupt modeling logic is then invoked from within the processor/thread modeling as previously described in connection with FIG. 12.

Some embodiments include x86 computer platforms where interrupts are handled using the Programmable Interrupt Controller (PIC) device, which provides a flexible and scalable mechanism for prioritizing and dispatching interrupts to CPU cores or logical processors. In both regular and virtualized environments, x86 systems employ an I/O APIC (Advanced Programmable Interrupt Controller) device to manage interrupt handling, allowing for efficient interrupt distribution among multiple CPUs. When a CPU receives an interrupt, it saves the current state of its registers onto its stack, known as the "interrupt stack", which is typically stored in a reserved region of memory. The CPU then transfers control to the interrupt handler function, which processes the interrupt and may push additional data onto the stack as needed.

Some other embodiment involve ARM computer platforms where the Generic Interrupt Controller (GIC) device manages interrupts at the CPU level. In regular environments, ARM CPUs employ a similar interrupt stack mechanism to x86 systems, saving the current state of registers onto an interrupt stack when an interrupt is received. However, in virtualized environments, ARM systems use a more complex approach, employing a combination of the GIC and software-based interrupt management mechanisms. When an interrupt is received, the CPU saves its current state onto the interrupt stack, but may also transfer control to a VM-specific interrupt handler function that manages interrupts at the hypervisor level. Both the aforementioned scenarios can be modeled using the described interrupt modeling scheme.

Some embodiment involve RISC-V computer platforms where interrupt handling is typically managed using a combination of hardware and software mechanisms. In regular environments, RISC-V CPUs employ a simple interrupt stack mechanism, saving the current state of registers onto an interrupt stack when an interrupt is received. However, in virtualized environments, RISC-V systems rely on software-based interrupt management mechanisms, such as the VIRT-EXT extension for VM-exit and VM-entry handlers. When an interrupt is received, the CPU saves its current state onto a reserved region of memory, but may also transfer control to a hypervisor-specific interrupt handler function that manages interrupts at the virtual machine level. Once again both the aforementioned scenarios can be modeled using the described interrupt modeling scheme.

Adversarial Modeling Block 701

In some embodiments a mathematical model captures the behavior of a commodity computer platform in the presence of adversarial actions. These adversarial actions can take various forms, including program execution functions, instructions or memory load and store operations, and device Direct Memory Access (DMA) access and interrupts delivered to the system.

Figure 7:
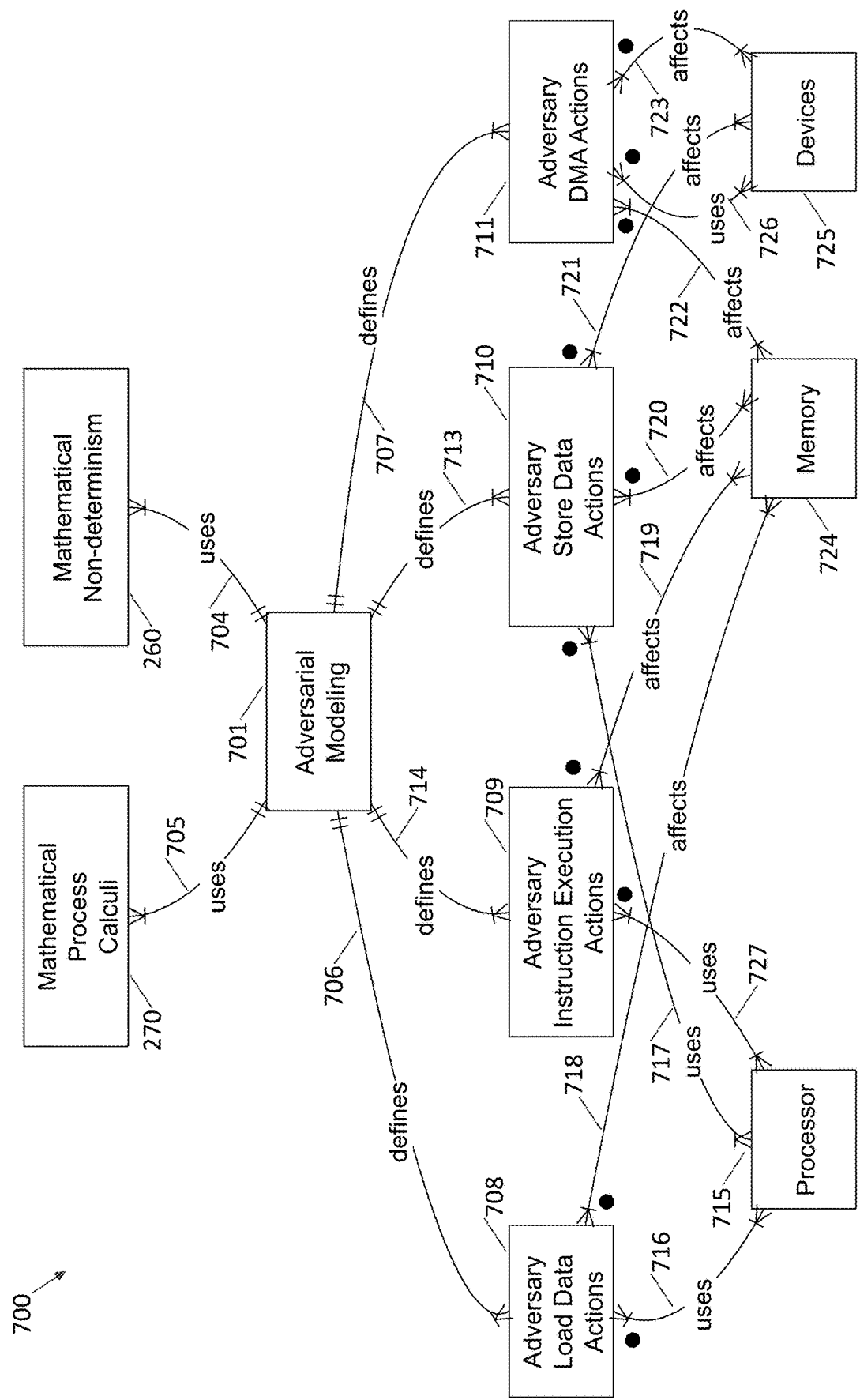
FIG. 7 is a system 700 for adversarial modeling using mathematical process calculi 270 and mathematical non-determinism 260 supporting sophisticated adversary able to read, write, execute and carry out DMA operations.

FIG. 7 shows a diagram of a subsystem 700 according to some embodiments. Subsystem 700 may be a subsystem to system 100; adversarial modeling block 401 is shown in both systems.

Adversarial modeling block 701 uses (see connecting line 705) one or more mathematical process calculi 270. Adversarial modeling block 701 uses (see connecting line 704) one or more mathematical non-determinism 260 blocks. Adversarial modeling block 701 defines (see connecting line 706) one or more adversary load data actions 708. Adversarial modeling block 701 defines (see connecting line 714) one or more adversary instruction execution actions 709. Adversarial modeling block 701 defines (see connecting line 713) one or more adversary store data actions 710. Adversarial modeling block 701 defines (see connecting line 707) one or more adversary DMA actions 711. Adversary load data actions 708 uses (see connecting line 716) one or more processors 715. Adversary load data actions 708 affects (see connecting line 718) one or more memories 724. Adversary instruction execution actions 709 uses (see connecting line 727) one or more processors 715. Adversary instruction execution actions 709 affects (see connecting line 719) one or more memories 724. Adversary store data actions 710 uses (see connecting line 717) one or more processors 715. Adversary store data actions 710 affects (see connecting line 720) one or more memories 724 and affects (see connecting line 721) one or more devices 725. Adversary DMA actions 711 uses (see connecting line 726) and affects (see connecting line 723) one or more devices 725. Adversary DMA actions 711 affects (see connecting line 722) one or more memories 724.

The adversarial actions are modeled using mathematical process calculi 270 and non-deterministic finite automata to ensure their non-deterministic and concurrent interleaving. This keeps the mathematical modeling as close to the real-world operational semantics of the adversary actions on a commodity computer platform.

In one embodiment, an adversary is modeled as a malicious device that performs unauthorized DMA transactions to read and/or write memory regions. This adversary can gain entry into the system through various means, such as network-based attacks or phishing schemes, and then execute unauthorized code or compromise data integrity. The adversarial model captures these actions at the lowest level of abstraction, focusing on memory read, write, and execute transactions.

FIGS. 14A-14C show snippets 1401 (FIG. 14A), 1402 (FIG. 14B) and 1403 (FIG. 14C) of computer code that may be used for the adversary modeling using the temporal logic of actions mathematical logic 302 and the high-level specification in the PlusCal language. The provided specification uses the temporal logic "either-or" specification which allows non-deterministic actions to be performed for adversary action execution. Such actions use the MMU modeling procedures mmu_load (snippet 1101, FIG. 11A) and mmu_execute (snippet 1103, FIG. 11C) and interrupt modeling procedures previously shown in FIGS. 13A-13C.

To guarantee strong security invariants in the presence of this powerful adversary, the method involves analyzing mathematical invariants using a computer-assisted theorem proving system. These invariants are encoded into the system to determine whether the Model Security Property (MSP 601) for either the security or availability aspect of the commodity computer platform is satisfied in the presence of adversarial actions.

The process begins with specifying a mathematical model that accurately captures the behavior of the commodity computer platform, including the adversarial actions that can occur within it. This model serves as a foundation for analyzing the system's security properties and identifying potential vulnerabilities.

Next, the method involves encoding the mathematical invariants into a computer-assisted theorem proving system. These invariants represent specific properties or conditions that must be met for the system to maintain its desired level of security and availability in the presence of an active adversary. By analyzing these invariants using the theorem proving system, it is possible to determine whether the MSP 601 is satisfied, even in the presence of adversarial actions.

Analyzing Model Security Properties 801 on the Model

Figure 8:
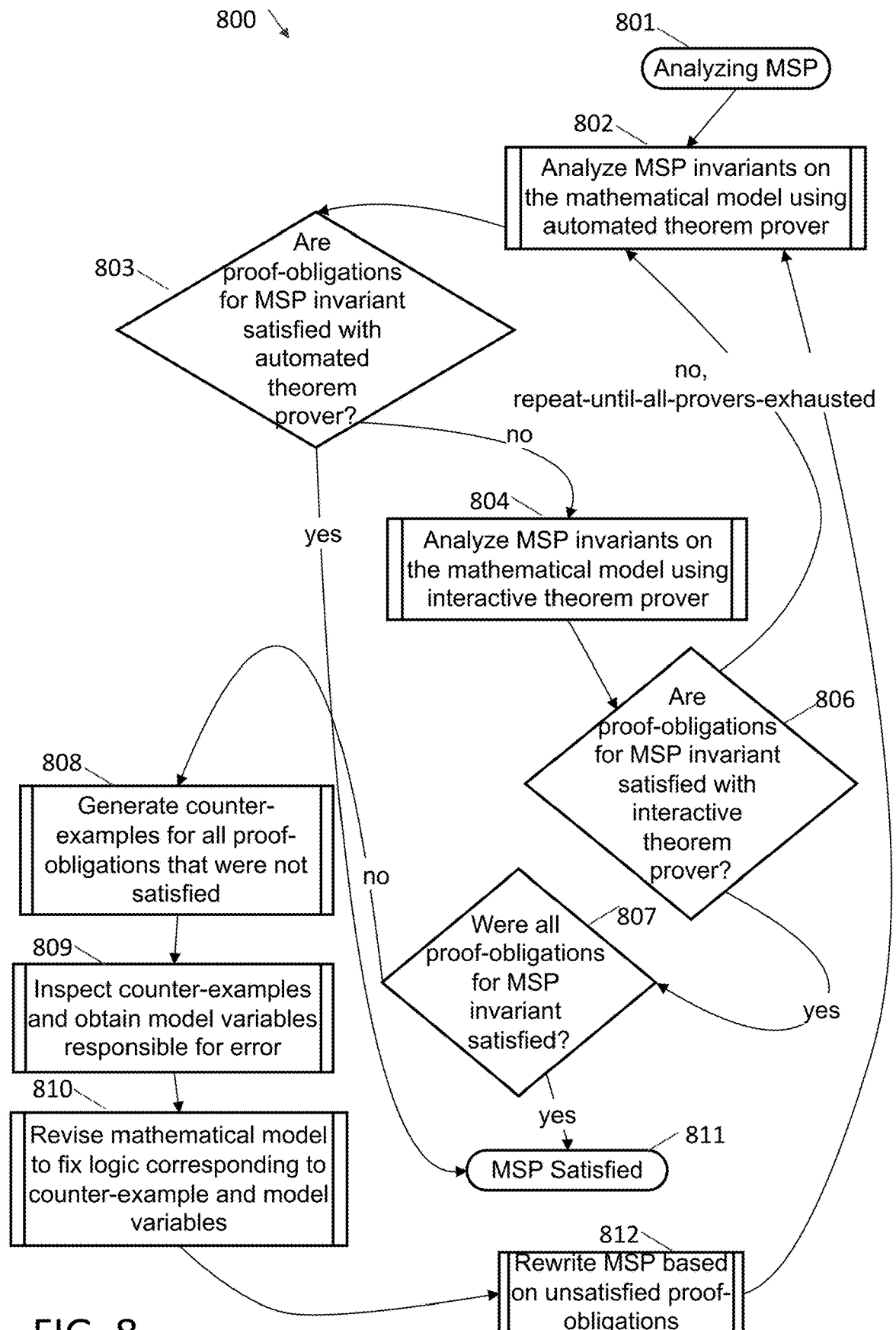
FIG. 8 is a flow diagram of a method 800 for analyzing a model security property (MSP 601) within a mathematical model of hardware and software stacks of a computer platforms.

FIG. 8 shows flow diagram for a method 800 for analyzing the mathematical invariants to determine whether an MSP 601 for either the security or availability aspect of the computer platform is satisfied, according to some embodiments. This analysis can be performed using automated and/or interactive theorem provers 850 that translate predicates into proof obligations. In some embodiments, counterexamples are generated that show that an MSP 601 does not hold for an operational aspect of the commodity computer platform, which can indicate non-compliance with applicable cybersecurity regulations.

The method provides for generating a counterexample upon determining that the MSP 601 is not satisfied. This counterexample shows that the MSP 601 does not hold for the commodity computer platform program execution and provides insight into why this may be the case. This information is used to then revise the mathematical model to fix logic corresponding to the counterexample and model variables. Finally, if there still remains unsatisfied proof-obligations, the MSP 601 is rewritten based on the unsatisfied proof-obligations and the aforementioned steps are repeated until the MSP 601 is satisfied.

At step 813, according to some embodiments of method 800, analyzing an MSP 601 begins.

At step 802, according to some embodiments of method 800, an automated theorem prover is used to analyze MSP 601 invariants on the mathematical model.

At step 803, according to some embodiments of method 800, a determination is made whether proof obligations for the MSP 601 invariant are satisfied with the automated theorem prover based on the analysis at step 802. If satisfied ("yes"), method 800 proceeds to step 811. If not satisfied ("no") method 800 proceeds to step 804.

At step 811, according to some embodiments of method 800, the termination that the MSP 601 is satisfied ends method 800.

At step 804, according to some embodiments of method 800, an interactive theorem prover is used to analyze MSP 601 invariants on the mathematical model.

At step 806, according to some embodiments of method 800, a determination is made whether proof obligations for the MSP 601 invariant are satisfied with the interactive theorem provers 850 based on the analysis at step 804. If satisfied ("yes"), method 800 proceeds to step 807. If the proof obligations are not satisfied ("no") method 800 returns to step 802 where the process is repeated until the MSP 601 is satisfied or all provers have been exhausted.

At step 807, according to some embodiments of method 800, a determination is made whether all proof-obligations for an MSP 601 invariant were satisfied. If satisfied ("yes"), method 800 proceeds to step 811 ("MSP 601 Satisfied"). If not satisfied ("no") method 800 proceeds to step 808.

At step 808, according to some embodiments of method 800, one or more counterexamples are generated for all proof obligations that were not satisfied.

At step 809, according to some embodiments of method 800, the counterexamples are inspected and the model variables responsible for the error are obtained.

At step 810, according to some embodiments of method 800, the mathematical model to fix logic corresponding to the counterexample and the model variables responsible for the error are revised.

At step 812, according to some embodiments of method 800, method 800 Rewrites MSP 601 the based on the unsatisfied proof obligations.

After step 821, according to some embodiments of method 800, method 800 returns to step 802.

FIG. 15A-15C shows snippets 1501 (FIG. 15A), 1502 (FIG. 15B) and 1503 (FIG. 15C) of computer code that may be used for the MSP 601 defined using the temporal logic of actions mathematical logic 302. The provided MSP 601 invariants span memory-safety, memory-integrity and control-flow integrity properties all specified using program elements, processor, memory and device modeling variables introduced previously.

In one embodiment of the disclosed invention, analyzing the MSP 601 comprises a computer-assisted theorem proving system, such as Z3, CVC4, or Alt-ergo, to analyze the mathematical invariants and determine if the MSP 601 is satisfied. Alternatively, an interactive theorem prover like Coq can be used for MSP 601 verification.

The use of a computer-assisted theorem proving system provides several key benefits. Firstly, it allows for the automated analysis of complex mathematical expressions and the identification of potential security vulnerabilities. This can be particularly valuable in large-scale systems where manual analysis may be impractical or unreliable.

Secondly, the theorem proving system can help to establish a formal proof that the MSP 601 is satisfied, providing a high degree of confidence in the system's security properties. This can be essential for applications where the consequences of a security failure are severe, such as in financial trading systems or critical infrastructure control systems.

Embedding MSP Block 601 within an Implementation

In some embodiments, the method for mathematical modeling of hardware and software stack of commodity computer platforms provides provable guarantees on memory, device, and program execution. Some embodiments, as shown in FIG. 1, involve realizing model system property (MSP) block 601 in program element implementation via various means, including computer platform hardware capabilities (block 602), modifications to source code (block 603), and direct binary modification (block 604).

In some embodiments, the mathematical modeling approach allows for the realization of MSP 601 in program element implementation. This approach involves utilizing commodity processor security capabilities such as privilege levels, hardware virtual machines, segmentation, and memory protection extensions as well as software instruction guard mechanisms to ensure secure and reliable execution of programs on commodity computer platforms. By leveraging these hardware and software capabilities, the method may provide provable guarantees on memory, device, and program execution, thereby enhancing overall system security and reliability.

In some embodiments, the MSP 601 is realized in program element implementation via modifications to the source code. This involves using compilers that allow various translation paths to add the MSP 601 into the final binary generated by the compiler. For instance, programmers can customize compilers to embed the MSP 601 in libraries, kernel, applications, or kernel extensions, thereby ensuring that the MSP 601 is integrated into the program element from the outset. By doing so, the method may provide a robust and reliable means of guaranteeing memory, device, and program execution on commodity computer platforms.

In some embodiments, the MSP 601 is realized directly in the program element binary using binary rewriting tools as well as disassemblers that can produce a machine language equivalent of the program element. This approach involves taking an existing binary instruction set and modifying it to include the MSP 601, thereby ensuring that the program element executes with provable guarantees on memory, device, and program execution. By leveraging binary rewriting tools and disassemblers, programmers can directly modify the binary instruction set to incorporate the MSP 601, thereby enhancing overall system security and reliability.

The mathematical modeling approach may allow for a high degree of flexibility in realizing the MSP 601 in program element implementation. Whether via hardware capabilities, modifications to source code, or direct binary modification, the method provides a robust and reliable means of guaranteeing memory, device, and program execution on commodity computer platforms. By leveraging the power of mathematical modeling, programmers can create highly secure and reliable systems that are capable of executing complex programs with provable guarantees on memory, device, and program execution.

Model Proof Tactics 901

System 100 may utilize model proof tactics 901 to generate computer-implemented mathematical induction proofs, ensuring the correctness and reliability of system model properties. In some embodiments, a commodity computer platform's mathematical model defines specific computer-implemented model tactics ("MTs"). These MTs may be designed to produce computer-implemented mathematical induction proofs for invariants related to system model properties. These MTs may provide a robust and reliable verification mechanism, guaranteeing that the commodity computer platform's behavior satisfies specific requirements. MTs may be divided into three categories as shown by subsystem 900 in FIG. 9. "Model Proof Tactics" are tactics related to the proof skeleton, body, and decomposition including facts and definitions. "Model basic tactics" deal with model data structures, constants and model program element stack operations. "Model variable tactics" deal with alteration, flow and lemmas involving various model variables.

Figure 9:
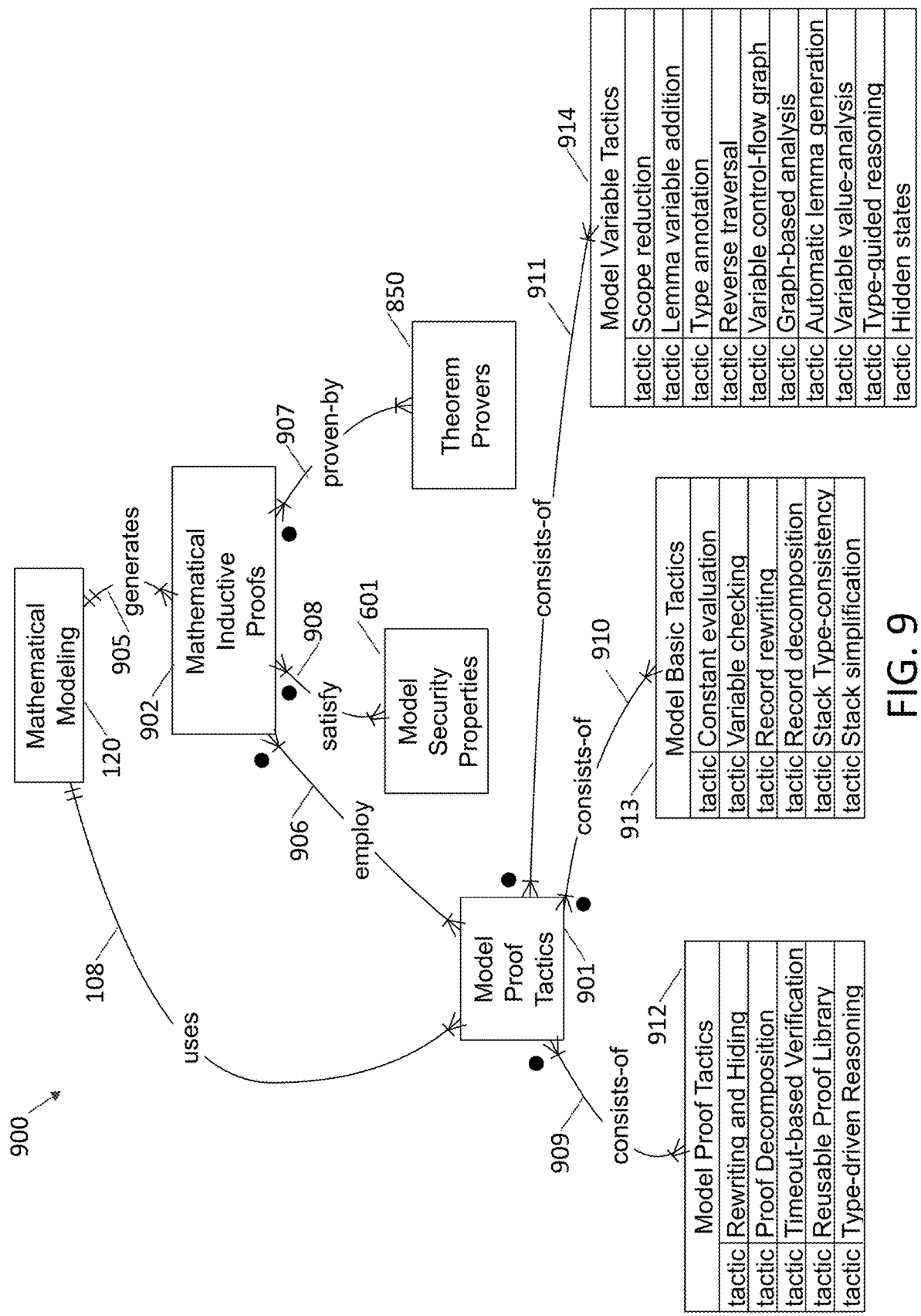
FIG. 9 is a system 900 for implementing methods of modeling and proof tactics (MTs) for generating mathematical induction proofs related to system model properties.

FIG. 9 shows a diagram of subsystem 900. Subsystem 900 may be a subsystem to system 100; Model proof tactics 901 and mathematical modelling block 120 are shown in both systems.

As discussed in connection with system 100 in FIG. 1, mathematical modeling block 120 uses (see connecting line 108) one or more model proof tactics 901. Mathematical modeling block 120 generates (see connecting line 905) one or more mathematical inductive proofs 902. The mathematical inductive proofs 902 employ (see connecting line 906) one or more model proof tactics 901. The mathematical inductive proofs 902 satisfy (see connecting line 908) MSP 601. The mathematical inductive proofs 902 are proven by (see connecting line 907) one or more theorem provers 850. Model proof tactics 901 consists of (connecting line 909) one or more model proof tactics table 912, consists of (connecting line 910) one or more model basic tactics tables 913, and consists of (connecting line 911) one or more model variable tactics table 914.

Model proof tactics 901 may include tactics such as, for example and not limitation, rewriting and hiding, proof decomposition, timeout-based verification, reusable proof library, and type driven reasoning as shown in table 912.

The rewriting and hiding tactic may be used to isolate individual proof obligations and prove them within a minimized environment. In this case, a proof step may be removed from the body of the proof while retaining relevant facts to reduce translation and verification complexity, and its verification result may be used as a result in the main proof body. This tactic is also used to overcome complexity that is added by proof facts which cannot be handled with higher timeouts alone.

The proof decomposition tactic may involve full decomposition of invariant proof including all possible disjunction reduction and automatic inclusion of necessary facts and definitions. Full decomposition means the proof is broken into small obligations such that each obligation has no conjunctions or disjunctions, implication is reduced, or any other suitable reduction of model variables or a combination of model variables. Also, each of these obligations is verified over each smallest step of model execution. Invariant proof decomposition also includes expanding non-matching definitions that are included in proof facts and obligations so that all relations can be evaluated. Some facts must be specified for proper prover translation, such as which parts of a data structure are unaltered upon modification.

Verification time of proof-obligations is reduced greatly by using dynamic timeouts because backend solvers are used in sequence, which could lead to completing unnecessarily long timeouts for prover failures earlier in the sequence than a lower timeout success (timeout-based verification). Skipping such verified obligations entirely is not automatic behavior of existing proof systems (e.g., Temporal Logic Proof System, TLAPS).

Reusable Proof Library: Some logical truths are not always automatically determinable by the backend provers, and their need can be automatically determined and included. Proof structure is reused for logically similar proof obligation and fact sets.

Type-driven Reasoning: using type for model execution path location for processor program counter, processor stack pointer and program element stack types. Backend theorem provers 850 require type information to reason about values of variables, some of which must be added by the user, but may always be automatically determined. For example, to reason about information in a stack entry, the stack type must be determined and defined.

Model basic tactics may include tactics such as, for example and not limitation, constant evaluation, variable checking, record rewriting, record decomposition, stack type consistency, and stack simplification.

Constant evaluation is a tactic to automatically evaluate model constants and arithmetic/set relations. Expressions with constants are automatically reduced to the simplest value. Set inclusion relations are specified for backend theorem provers 850 when the backend/translator cannot determine automatically, e.g., that if A is a subset of B and e is true of all elements of B, then e is true of all elements of A.

Variable checking is a method for adding automatic model variable checks. These include model variable unchanged checks where needed and all model variable non-self-unchanged checks for process-indexed target model variable alteration. Proving a portion of a data structure, or even a whole variable, is unchanged is a commonly needed intervention. A domain specific proof language (e.g., PlusCal) to a mathematical logic 302 (e.g., temporal logic or TLA+) along with the modeling approach guarantee all variables indexed by the current process number (self) in mathematical process calculi 270 are unchanged at all other indices. This is not always recognized by existing backend theorem provers 850.

Record rewriting is a method for rewriting model record definitions to directly set the new value of record fields. A domain specific proof language (e.g., PlusCal) record alteration translations are needlessly complicated and are often not understood directly by the backend theorem provers 850. This tactic rewrites the model record definitions to directly set values of record fields so that backend theorem provers 850 can parse them effectively.

Record decomposition is a method to decompose all model record declarations. Model record definitions can be broken up into their component variables, greatly simplifying proofs by removing the need to reason about other parts of the record. The resulting model that would be produced is then solely used for proof purposes.

Stack type consistency is a method for editing entries in program element stack modeling to have consistent types. A stack of records cannot be reasoned about by the provers if each record does not have the same type, meaning unchanged fields must be added so that every stack element has the same fields. This allows the backend provers to reason about the program element stack of records.

Stack simplification is a method to remove unnecessary stack frame retrieval for program element stack modeling. A domain specific proof language (e.g., PlusCal) to a mathematical logic 302 (e.g., temporal logic or TLA+) translation uses a stack to restore precall values of arguments and locals, neither of which are ever altered in the function body, so do not need to be restored to stored values. This greatly simplifies reasoning of proof obligations by existing backend theorem provers 850

Model variable tactics may include tactics such as, for example and not limitation, scope reduction, lemma variable addition, type annotation, reverse traversal, variable control-flow graph, graph-based analysis, automatic lemma generation, variable value analysis, type-guided reasoning, and hidden states.

Scope reduction is a method for removal of out-of-scope reference/alterations of model variables. Translation from a domain specific proof language (e.g., PlusCal) to a mathematical logic 302 (e.g., temporal logic or TLA+) does not include or enforce scoping, and so portions of the model with out-of-scope or unused variables may be removed without altering the semantics of the model, while sometimes greatly reducing the proof burden for backend theorem provers 850. For example, it may be desired to know the value of a variable at a specific execution point, and be able to remove superfluous alterations of this variable in other parts of the model, with no semantic effect.

Lemma variable addition is a method to add in model variables of interest and their types for each lemma. A model variable of interest is one whose value affects the validity of a lemma/invariant. This assists in determining which proof steps cannot be proved trivially. This allows for automatic determination for when a new lemma must be added to provide value analysis for a relevant variable.

Type annotation is a method to write types for all target variables or variables they touch. Backend theorem provers 850 require type information to reason about values of variables, some of which must be added, but may always be automatically determined. For example, to reason about what setting a variable to the value of another, type information is sometimes needed to be added to the facts to help theorem provers 850 prove proof obligations.

Reverse traversal is a method that uses a data flow graph to trace back for model value and determine location set where it holds: This tactic allows for adding the value of a variable set previously in execution to the available proof facts.

Variable control-flow graph is a tactic to create full control flow graph tracking target model variables and relevant state, or ad-hoc create smaller graphs working back to all alterations of target variables. This helps solve proof obligations that depend on a set of model variable states.

Graph-based analysis: A method to create a graph to work back to all alterations of target variables. This tactic creates graph information tracking all alterations of model target variables. Information from this graph is used to generate lemmas supporting proof obligations. For example, we want invariant $x \leq 5$ at program element counter=15 and $x:=y$ at program element counter=10. We can work back in the graph to find this setting and add lemmas that $x<=5$ while program element counter is in the set flowing between 10 and 15 and $y \leq 5$ at program element counter=10.

Automatic lemma generation is a method to automatically generate lemma when a target variable set to other variable value. This tactic automatically generates lemma that would extend the claims on the target variable from an invariant to the new variable.

Variable value analysis is a tactic that works by adding type checking on all steps in paths between target locations for a variable and its preceding alterations. Model checking can be used to verify this type checking does not change model semantics. Lemmas will not be needed to add facts needed for proof, in this case, because the needed facts will be part of the propagated type check. This is similar to adding asserts to the model at all steps where it is needed to know something about the value of a variable, and then determining if this generates any contradictions in the model.

Type-guided reasoning is a method that uses variable types when doing inclusions or comparisons. The type information must be added to available facts to help the backend determine relational truths when set inclusions or comparisons are used within proof obligations.

Hidden states is a method that adds invisible history/prophecy variables to model and verify their consistency. A model variable can be added to a model without changing its semantics outside of that variable. Such a variable could be a count for the size of a stack. If we need to show a stack never has 6 elements, we can add a variable to track stack size throughout the model, and show it never equals 6, rather than doing something similar and far more arduous in the proof.

MTs produce computer-implemented mathematical induction proofs for invariants related to system model properties. The induction proofs are then analyzed to determine whether an MSP 601 for a commodity computer platform is satisfied and upon a determination that the MSP 601 is not satisfied, a proof counter-example is generated that shows that the MSP 601 does not hold for the commodity computer platform program execution.

FIGS. 16A-16B shows snippets 1601 (FIG. 16A) and 1602 (FIG. 16B) representing an embodiment of the model proof tactics 901 used to carry out computer-assisted proving of mathematical inductive proofs 902 on the MSP 601 invariants that were described previously in FIG. 15. The model proof tactics in the embodiment uses the Temporal Logic of Actions framework Proof-Manager ("TLAPM") to encode hierarchical theorems and lemmas corresponding to the inductive proof of the MSP 601 invariant.

The analysis mechanism includes encoding the mathematical induction proofs into a computer assisted theorem proving system to determine whether the MSP 601 for either the security and/or availability aspect of the commodity computer platform is satisfied. This theorem proving system can be automated as in the case of theorem provers 850 such as, for example and not limitation, Z3, Alt-Ergo, and CVC4, or interactive as in the case of theorem provers 850 such as Coq.

Figure 17:
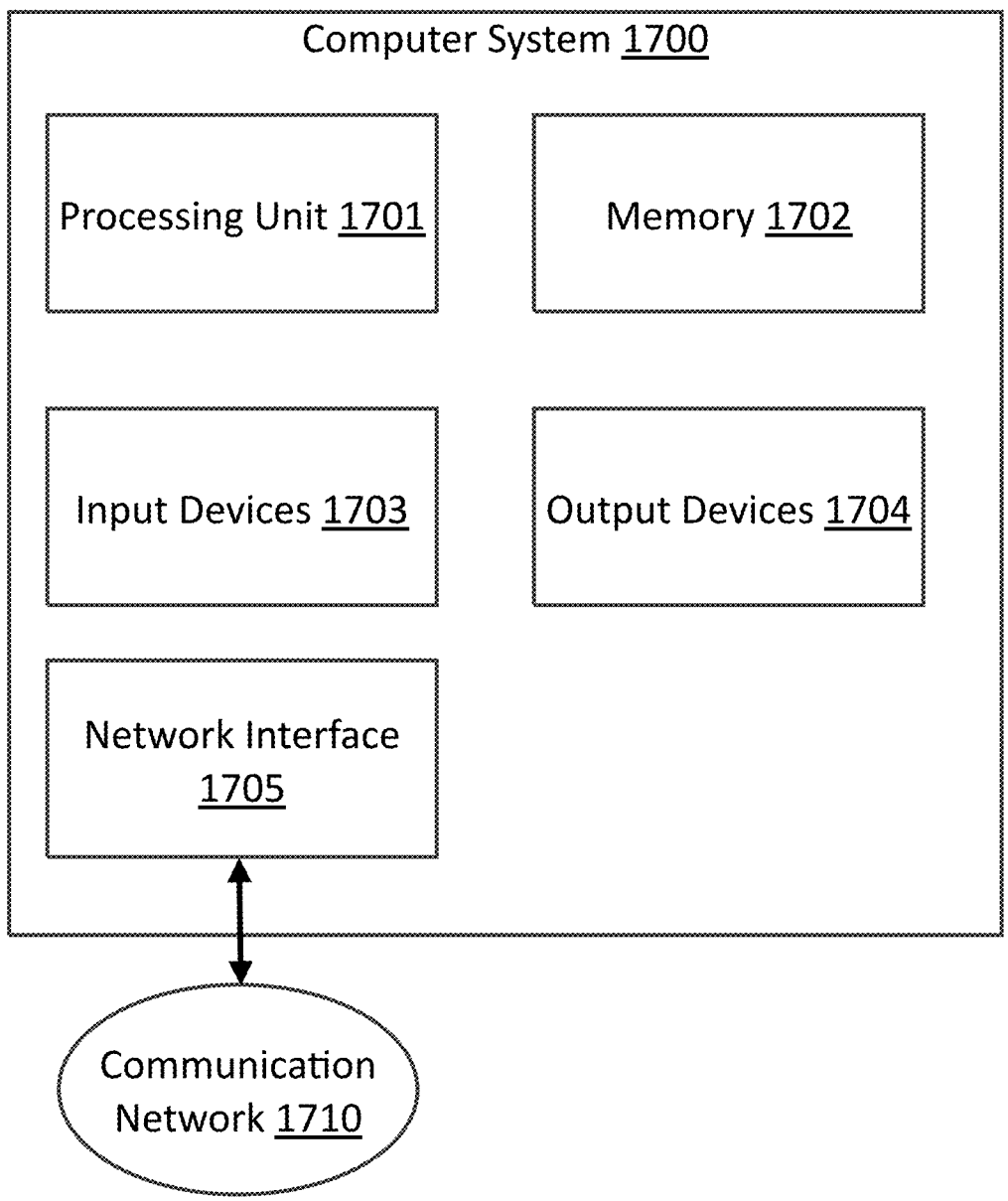
FIG. 17 shows, schematically, an illustrative computer system 1700 on which aspects of the present disclosure may be implemented.

FIG. 17 shows, schematically, an illustrative computer system 1700 on which aspects of the present disclosure may be implemented. For example, computer system 1700 may be used to implement system 100 and/or the subsystems discussed herein. In the example of FIG. 17, the computer system 1700 includes a processing unit 1701 having one or more computer hardware processors and one or more articles of manufacture that comprise at least one non-transitory computer-readable storage medium (e.g., a memory 1702) that may include, for example, volatile and/or non-volatile memory. Memory 1702 may store one or more instructions to program the processing unit 1701 to perform any of the functions described herein. Memory 1702 may also store one or more application programs and/or resources used by application programs (e.g., software libraries). Different portions of memory 1702 may be used for different storage purposes. For example, a non-volatile portion of memory 1702 may be used for long term storage, while volatile memory may be used to facilitate fast access for processing unit 1702. Though, memory 1702 may include any suitable type or combination of types of computer storage media that are able to store data. To perform any of the illustrative functionalities described herein, processing unit 1701 may execute one or more processor-executable instructions stored in memory 1702, which may serve as non-transitory computer-readable media storing processor-executable instructions for execution by the processing unit 1701.

The computer system 1700 may have one or more input devices and/or output devices, such as devices 1703 and 1704 illustrated in FIG. 17. These devices may be used, for instance, to present a user interface. Examples of output devices that may be used to provide a user interface include printers, display screens, and other devices for visual output, speakers and other devices for audible output, braille displays and other devices for haptic output, etc. Examples of input devices that may be used for a user interface include keyboards, pointing devices (e.g., mice, touch pads, and digitizing tablets), microphones, etc. For instance, the input devices 1703 may include a microphone for capturing audio signals, and the output devices 1704 may include a display screen for visually rendering, and/or a speaker for audibly rendering, recognized text.

In the example of FIG. 17, computer system 1700 also includes one or more network interfaces (e.g., a network interface 1705) to enable communication via various networks (e.g., a network 1710). Computer networks include, for example and not limitation, local area networks (e.g., an enterprise network) and wide area networks (e.g., the Internet). Such networks may be based on any suitable technology operating according to any suitable protocol, and may include wireless networks and/or wired networks (e.g., fiber optic networks). It should be appreciated that components of computer system 1700 may be distributed across a computer network; this may be done, for example, to facilitate distributed processing, to achieve connectivity with (e.g., remote) input devices and/or output devices, or for any other suitable reason.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Accordingly, the foregoing description and drawings are by way of example only.

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

In this respect, it should be appreciated that one implementation of the above-described embodiments comprises at least one computer-readable medium encoded with a computer program (e.g., a plurality of instructions), which, when executed on a processor, performs some or all of the above-discussed functions of these embodiments. As used herein, the term "computer-readable medium" encompasses only a computer-readable medium that can be considered to be a machine or a manufacture (i.e., article of manufacture). A computer-readable medium may be, for example, a tangible medium on which computer-readable information may be encoded or stored, a storage medium on which computer-readable information may be encoded or stored, and/or a non-transitory medium on which computer-readable information may be encoded or stored. Other non-exhaustive examples of computer-readable media include a computer memory (e.g., a ROM, a RAM, a flash memory, or other type of computer memory), a magnetic disc or tape, an optical disc, and/or other types of computer-readable media that can be considered to be a machine or a manufacture.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

The term "define" (including, e.g., "defines", "defining") is used interchangeably with the term "specify" (including e.g., "specifies", "specifying").

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical values appeared in this specification are deemed modified by a term of degree thereby reflecting their intrinsic uncertainty.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A system for providing formal verification of a design and operation of a computer platform, the system comprising:
    at least one processor; and
    at least one computer-readable storage medium having stored thereon instructions which, when executed, program the at least one processor to perform act(s) of:
    evaluating a mathematical model that defines interfaces to hardware elements and software stack elements of the computer platform, encodes operational aspects of the hardware elements and software stack elements using the interfaces, and specifies invariants with assume-guarantee interface-confined mathematical reasoning,
    wherein the evaluating determines whether the invariants hold throughout the lifetime of the computer platform
    wherein
        the hardware elements and software stack elements of the computer platform comprise memory, peripherals, computing processors and program execution elements;
        the interfaces include a direct memory access (DMA) interface;
        the mathematical model specifies at least one peripheral among the peripherals that accesses the memory via the DMA interface;
        the DMA interface is governed by one or more DMA access control tables and/or channels which specify access control permissions of said peripheral to access specified regions of the memory;
        the one or more DMA access control tables and/or channels are implemented in hardware and programmable via software source or binary embedding within the program execution element; and
        the DMA interface is modeled via mathematical process calculi logic allowing for multiple hardware elements to access the DMA interface concurrently in the computer platform.

2. The system of claim 1, wherein the mathematical model is defined in one or more mathematical logic languages.

3. The system of claim 1, wherein a peripheral among the peripherals is a validated computer platform.

4. The system of claim 1, wherein
    the computer platform is a first computer platform and the mathematical model is a first mathematical model,
    the at least one computer-readable storage medium further has stored thereon instructions which, when executed, program the at least one processor to perform additional acts of
    evaluating a second mathematical model for a second computer platform; and
    if the invariants hold for both the first and second computer platform, determining that a combined computer platform, consisting of both the first and second computer platform, is validated.

5. The system of claim 1, wherein at least one of the invariants is a security property.

6. The system of claim 5, wherein the security property is selected from the group consisting of control-flow integrity, memory safety, memory-integrity, privilege separation, and approved execution, and authorized data encryption and decryption.

7. The system of claim 1, wherein the invariants specified by the mathematical model include at least one liveness property that is used to describe availability of a platform resource.

8. The system of claim 1, wherein the invariants specified by the mathematical model are formulated using the interfaces.

9. The system of claim 1, wherein determining from the mathematical model whether the invariants hold throughout the lifetime of the computer platform comprises analyzing the invariants to determine whether a model system property (MSP) is satisfied.

10. The system of claim 9, wherein analyzing the invariants to determine whether the MSP is satisfied comprises encoding the invariants into a computer-assisted theorem proving system and using the computer-assisted theorem proving system to analyze the invariants to determine if the MSP is satisfied.

11. The system of claim 9, wherein the at least one computer-readable storage medium further has stored thereon instructions which, when executed, program the at least one processor to perform additional act(s) of:
  if the MSP is found not to be satisfied, generating a counterexample that shows that the MSP does not hold for an operational aspect among the operational aspects of the computer platform.

12. The system of claim 1, wherein
  the mathematical model further defines an operational state space for the computer platform; and
  determining from the mathematical model whether the invariants hold throughout the lifetime of the computer platform comprises determining if a state in the operational state space can be reached from an initial state for all possible state transitions of the mathematical model.

13. A method for formal verification of a design and operation of a computer platform, the method comprising act(s) of:
  defining interfaces to hardware elements and software stack elements of the computer platform in a mathematical model;
  encoding operational aspects of the hardware elements and software stack elements using the interfaces in the mathematical model;
  specifying invariants with assume-guarantee interface-confined mathematical reasoning in the mathematical model; and
  evaluating the mathematical model to determine whether the invariants hold throughout the lifetime of the computer platform
wherein
  the hardware elements and software stack elements of the computer platform comprise memory, peripherals, computing processors and program execution elements;
  the interfaces include a direct memory access (DMA) interface;
  the mathematical model specifies at least one peripheral among the peripherals that accesses the memory via the DMA interface;
  the DMA interface is governed by one or more DMA access control tables and/or channels which specify access control permissions of said peripheral to access specified regions of the memory;
  the one or more DMA access control tables and/or channels are implemented in hardware and programmable via software source or binary embedding within the program execution element; and
  the DMA interface is modeled via mathematical process calculi logic allowing for multiple hardware elements to access the DMA interface concurrently in the computer platform.

14. The method of claim 13, wherein the mathematical model is provided in one or more mathematical logic languages.

15. At least one computer-readable storage medium having stored thereon instructions which, when executed, program at least one processor to perform a method comprising acts of:
  defining interfaces to hardware elements and software stack elements of a computer platform in a mathematical model;
  encoding operational aspects of the hardware elements and software stack elements using the interfaces in the mathematical model;
  specifying invariants with assume-guarantee interface-confined mathematical reasoning in the mathematical model; and
  evaluating the mathematical model to determine whether the invariants hold throughout the lifetime of the computer platform
wherein
  the hardware elements and software stack elements of the computer platform comprise memory, peripherals, computing processors and program execution elements;
  the interfaces include a direct memory access (DMA) interface;
  the mathematical model specifies at least one peripheral among the peripherals that accesses the memory via the DMA interface;
  the DMA interface is governed by one or more DMA access control tables and/or channels which specify access control permissions of said peripheral to access specified regions of the memory;
  the one or more DMA access control tables and/or channels are implemented in hardware and programmable via software source or binary embedding within the program execution element; and
  the DMA interface is modeled via mathematical process calculi logic allowing for multiple hardware elements to access the DMA interface concurrently in the computer platform.

16. The least one computer-readable storage medium of claim 15, wherein the mathematical model is provided in one or more mathematical logic languages.

* * * * *